(12) United States Patent
Saino

(10) Patent No.: US 9,601,384 B2
(45) Date of Patent: *Mar. 21, 2017

(54) METHOD OF FORMING A SEMICONDUCTOR DEVICE COMPRISING FIRST AND SECOND NITRIDE LAYERS

(71) Applicant: Micron Technology, Inc., Boise, ID (US)

(72) Inventor: Kanta Saino, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/874,652

(22) Filed: Oct. 5, 2015

(65) Prior Publication Data

US 2016/0027701 A1 Jan. 28, 2016

Related U.S. Application Data

(63) Continuation of application No. 14/450,674, filed on Aug. 4, 2014, now Pat. No. 9,178,017.

(30) Foreign Application Priority Data

Aug. 21, 2013 (JP) ................................. 2013-171305

(51) Int. Cl.
*H01L 21/70* (2006.01)
*H01L 21/8234* (2006.01)
(Continued)

(52) U.S. Cl.
CPC .... *H01L 21/823462* (2013.01); *H01L 21/761* (2013.01); *H01L 21/76229* (2013.01); *H01L 21/823481* (2013.01); *H01L 27/10814* (2013.01); *H01L 27/10823* (2013.01); *H01L 27/10855* (2013.01); *H01L 27/10876* (2013.01);
(Continued)

(58) Field of Classification Search
CPC ......... H01L 27/10876; H01L 27/10805; H01L 27/10873; H01L 27/10855; H01L 27/10814
See application file for complete search history.

(56) References Cited

U.S. PATENT DOCUMENTS 7,964,489 B2 6/2011 Koyama et al.
9,202,758 B1 * 12/2015 Besser ............ H01L 21/823418
(Continued)

FOREIGN PATENT DOCUMENTS

JP 2006-024594 1/2006
JP 2007-329237 12/2007
JP 2007-329327 12/2007

*Primary Examiner* — Dale E Page
*Assistant Examiner* — Wasiul Haider
(74) *Attorney, Agent, or Firm* — Wells St. John, P.S.

(57) ABSTRACT

A semiconductor device includes a first well and a second well provided within a semiconductor substrate, an isolation region disposed between the first well and the second well within the semiconductor substrate, a first wiring disposed on the first well, a second wiring disposed on the second well, a concave third wiring disposed on the isolation region, a buried insulating film disposed on the third wiring so as to fill the concave portion thereof, a plurality of fourth wirings disposed on the buried insulating film, and a contact plug disposed so as to electrically connect to at least one of the first and second wells.

20 Claims, 28 Drawing Sheets

(51) Int. Cl.
    *H01L 29/06*     (2006.01)
    *H01L 27/108*     (2006.01)
    *H01L 21/761*     (2006.01)
    *H01L 21/762*     (2006.01)
    *H01L 21/768*     (2006.01)

(52) U.S. Cl.
    CPC .... *H01L 29/0649* (2013.01); *H01L 21/76834* (2013.01); *H01L 21/76838* (2013.01)

(56) References Cited

U.S. PATENT DOCUMENTS

| | | | |
|---|---|---|---|
| 2012/0091533 A1* | 4/2012 | Kim | H01L 21/823807 257/369 |
| 2012/0091539 A1* | 4/2012 | Fan | H01L 21/28123 257/401 |
| 2012/0228702 A1 | 9/2012 | Wu | |
| 2013/0059439 A1* | 3/2013 | Shinoda | C09G 1/02 438/693 |
| 2014/0027924 A1* | 1/2014 | Lee | H01L 21/48 257/774 |
| 2014/0091395 A1* | 4/2014 | Liu | H01L 21/823807 257/368 |
| 2014/0319518 A1* | 10/2014 | Furutani | G11C 11/403 257/43 |

\* cited by examiner

METHOD OF FORMING A SEMICONDUCTOR DEVICE COMPRISING FIRST AND SECOND NITRIDE LAYERS

RELATED PATENT DATA

This application is a continuation of U.S. patent application Ser. No. 14/450,674, which was filed on Aug. 4, 2014, which is based upon and claims the benefit of priority from Japanese Patent Application No. 2013-171305 filed on Aug. 21, 2013, the disclosures of which are incorporated herein in their entirety by reference.

BACKGROUND OF THE INVENTION

Field of the Invention

The present invention relates to a semiconductor device and a method for manufacturing the semiconductor device.

Description of the Related Art

In recent years, the miniaturization of semiconductor devices has made progress, thus resulting in a decrease in the equivalent oxide thickness (EOT) of a gate insulating film. Accordingly, a major increase in leakage current due to the decrease in the EOT has become problematic in a gate insulating film based on a silicon oxynitride film and a silicon oxide film, and a gate electrode structure made from polysilicon which have been used. Hence, an HKMG transistor is a focus of attention as a new technique to solve such a problem. The HKMG transistor is a transistor which comprises a gate insulating film including a high-dielectric insulating film higher in dielectric constant than oxide silicon, and a gate electrode including a metal layer. In the HKMG transistor, the high-dielectric insulating film is used for the gate insulating film, and therefore, gate leakage currents can be suppressed by increasing the physical thickness of the gate insulating film while decreasing the EOT. In addition, use of the gate electrode including the metal layer can improve the operating characteristics of the transistor.

JP2006-24594A and JP2007-329237A disclose the HKMG transistor.

A related method for manufacturing the HKMG transistor will be described with reference to FIGS. 26 to 28.

First, as illustrated in FIG. 26A, there is prepared semiconductor substrate 1 in which P well 3 and N well 4 are disposed through isolation region 2. A first laminated film including silicon oxide film 5a, first high-dielectric insulating film 6a, first metal film 7a, and impurity-containing polysilicon film 8a is formed on P well 3, and a second laminated film including silicon oxide film 5b, first high-dielectric insulating film 6b, second high-dielectric insulating film 6c, first metal film 7b, and impurity-containing polysilicon film 8b is formed on N well 4. At this time, one end 10a of the first laminated film and one end 10b of the second laminated film are positioned on isolation region 2. In addition, trench portion 13 is formed of a side surface of end 10a, a side surface of end 10b, and a front surface of isolation region 2.

As illustrated in FIG. 26B, impurity-containing polysilicon film 11 and second metal film 12 are formed so as to extend in first direction 60 indicated above semiconductor substrate 1 from the space on P well 3 through the space on isolation region 2 to the space on N well 4. At this time, trench portion 13 cannot be completely filled with polysilicon film 11 and second metal film 12 since the aspect ratio of trench portion 13 is high, and therefore, seam 14 arises within trench portion 13. Under this condition, silicon nitride film 15 for use as a mask is formed on semiconductor substrate 1 by a plasma CVD method, so as to cover second metal film 12. At this time, silicon nitride film 15 fails to completely fill seam 14 since the plasma CVD method is inferior in coverage (step coverage), and therefore, seam 14 remains within silicon nitride film 15.

As illustrated in FIG. 27A, silicon nitride film 15 is patterned to form hard mask 15. The first and second laminated films and portions of polysilicon film 11 and second metal film 12 on isolation region 2 are patterned by etching using hard mask 15. Consequently, first and second gate electrodes 17a and 17b are formed on P well 3 and N well 4, respectively, and wiring 20 is formed on isolation region 2. LDD regions 19a of the N conductivity type are formed within P well 3, and LDD regions 19b of the P conductivity type are formed within N well 4. Offset spacers 26a are formed on the side surfaces of first and second gate electrodes 17a and 17b and wiring 20. Thereafter, first source and drain 21a of the N conductivity type are formed within P well 3, and second source and drain 21b of the P conductivity type are formed within N well 4. SOD film 22 is formed on semiconductor substrate 1, and then CMP treatment or etched back of SOD film 22 is performed to expose hard mask 15. At this time, seam 14 remains as is within wiring 20, and second metal film 12 is exposed on the bottom of seam 14.

As illustrated in FIG. 27B, a contact hole to expose therein first source and drain 21a is formed within SOD film 22. Thereafter, an electrically conductive material is formed so as to fill the contact hole, thereby forming contact plug 24 therein. At this time, seam 14 within wiring 20 is also filled with the electrically conductive material to form conductive part 20a.

FIG. 28A is a plan view, and FIG. 28B represents a cross-sectional view taken along the A-A' direction of FIG. 28A. As illustrated in FIGS. 28A and 28B, wirings 25a and 25b are formed on SOD film 22, so as to contact with hard mask 15. Here, wirings 25a and 25b are electrically connected to conductive part 20a since conductive part 20a has been formed in the process of FIG. 27B. As a result, the related method has been problematic in that wirings 25a and 25b short-circuit to each other through conductive part 20a.

SUMMARY

In one embodiment, there is provided a semiconductor device comprising:
- a first well and a second well provided within a semiconductor substrate;
- an isolation region disposed between the first well and the second well within the semiconductor substrate;
- a first wiring disposed on the first well;
- a second wiring disposed on the second well;
- a concave third wiring disposed on the isolation region;
- a buried insulating film disposed on the third wiring so as to fill a concave portion thereof;
- a plurality of fourth wirings disposed on the buried insulating film; and
- a contact plug disposed so as to electrically connect to at least one of the first and second wells.

In another embodiment, there is provided a method for manufacturing a semiconductor device, comprising:
- preparing a semiconductor substrate including a first well, a second well, and an isolation region between the first well and the second well with respect to a first direction;
- forming a first conductive film which is located on the first well and one end of which in the first direction is positioned on the isolation region, and a second conductive film which is located on the second well and one end of which in the first direction is positioned on the isolation region;

forming a third conductive film, so as to extend from a space on the first conductive film through a space on the isolation region to a space on the second conductive film with respect to the first direction, and have a concave shape on the isolation region;

forming a buried insulating film on the third conductive film, so as to fill a concave portion of the third conductive film on the isolation region;

patterning the first to third conductive films and the buried insulating film to form a first wiring on the first well, a second wiring on the second well, and a concave third wiring and a buried insulating film on the isolation region;

forming an interlayer insulating film on the semiconductor substrate;

removing a portion of the interlayer insulating film until the buried insulating film is exposed;

forming a contact plug, so as to penetrate through the interlayer insulating film, resulting in contacting with at least one of the first and second wells; and forming a plurality of fourth wirings, so as to contact with the buried insulating film on the third wiring.

BRIEF DESCRIPTION OF THE DRAWINGS

The above features and advantages of the present invention will be more apparent from the following description of certain preferred embodiments taken in conjunction with the accompanying drawings, in which.

Figure 1:
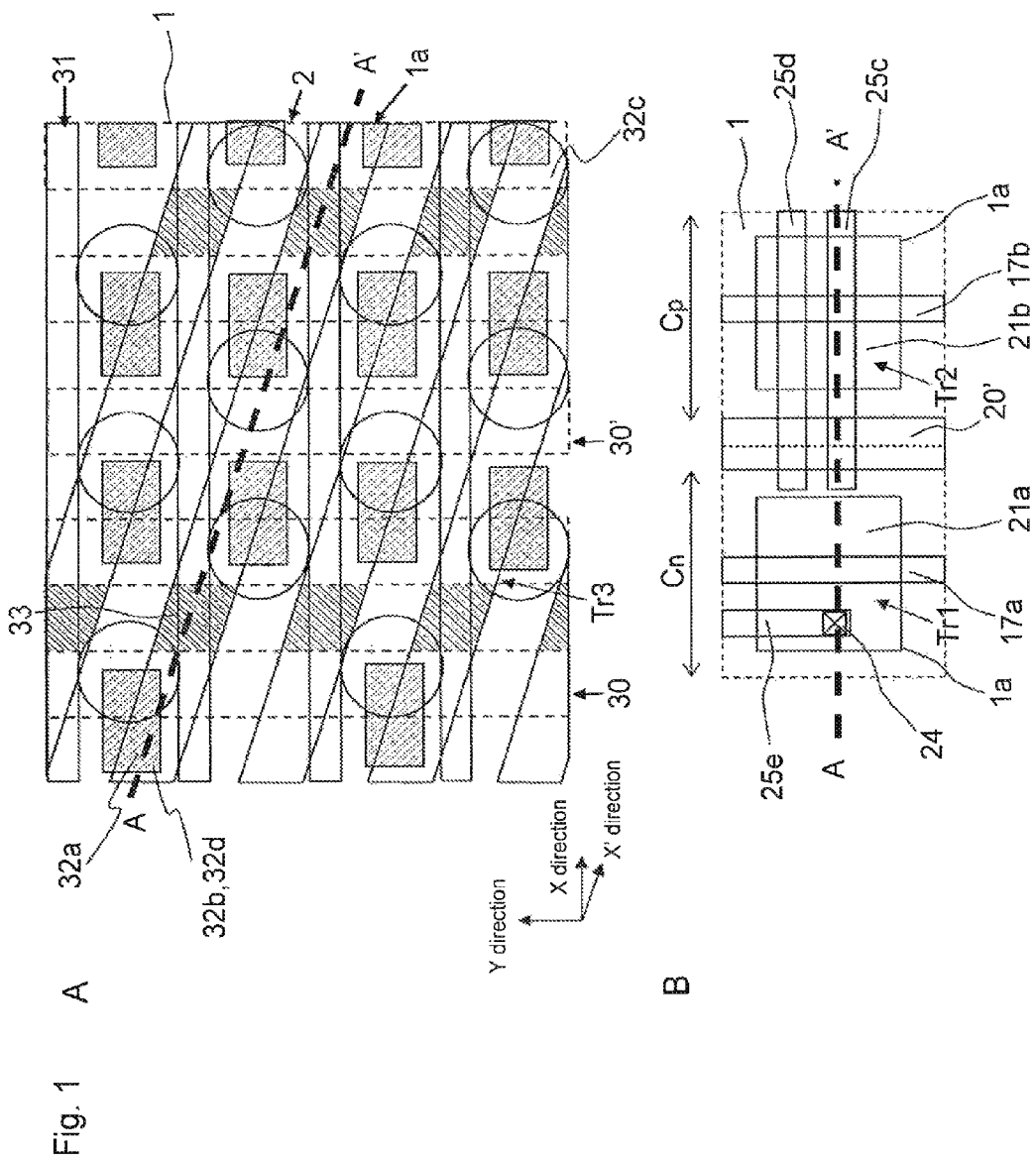
FIG. 1 is a plan view illustrating a semiconductor device according to the first exemplary embodiment.

In the drawings, numerals have the following meanings, 1: semiconductor substrate, 1a: active region, 2: isolation region, 2a, 52: silicon nitride film, 2b, 51, 58a, 58b: silicon oxide film, 3: P well, 4: N well, 5a, 5b: silicon oxide film, 6a, 6b: hafnium oxide film (first high-dielectric insulating film), 6c: aluminum oxide film (second high-dielectric insulating film), 7a, 7b: first metal film, 8a, 8b, 11, 11a, 11b, 11c, 11d: impurity-containing polysilicon film, 10a, 10b, 10c, 10d: end, 12, 12a, 12b, 12c, 12d: second metal film, 13: trench portion, 14: seam (concave portion), 15: silicon nitride film, 15a: buried insulating film, 15b: second insulating film, 15c: first insulating film, 17a: first gate electrode, 17b: second gate electrode, 19a, 19b: LDD region, 20, 25a, 25b: wiring, 20a: conductive part, 20': third wiring, 21a: first source and drain, 21b: second source and drain, 22: SOD film, 24: contact plug, 25c, 25d: fourth wiring, 25e: fifth wiring, 26a: offset spacer, 26b: sidewall spacer, 30: word line (buried gate electrode), 30': dummy word line, 30a: barrier metal film, 30b: metal gate film, 31: bit line, 32a: capacitor contact region, 32b, 32d: capacitor contact plug, 32c: capacitor contact pad, 33: bit contact region, 37: third gate insulating film, 38a: liner film, 38b: SOD film, 39: bit contact interlayer insulating film, 43: liner film, 45: stopper film, 48: capacitor, 48a: lower electrode, 48b: capacitor insulating film, 48c: upper electrode, 55: trench, 60: first direction, Cn: region for forming NMOS, Cp: region for forming PMOS, Tr1: first transistor, Tr2: second transistor, and Tr3: third transistor.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In one example of a semiconductor device and the manufacturing method thereof according to the present invention, a concave third wiring is disposed on an isolation region. In addition, a buried insulating film superior in coverage (step coverage) is formed so as to fill the concave portion of the third wiring. Consequently, even if a plurality of fourth wirings are formed on the buried insulating film, the third wiring and the fourth wirings are isolated from each other by the buried insulating film. Thus, it is possible to prevent a plurality of adjacent fourth wirings from short-circuiting to one another through the third wiring to degrade device characteristics.

Hereinafter, the semiconductor device and the manufacturing method thereof which are embodiments to which the present invention is applied will be described with reference to the accompanying drawings. Note that the drawings used in the following description are merely schematic, and length, width and thickness ratios and the like among respective drawings are not necessarily the same as actual ratios. Accordingly, length, width and thickness ratios and the like among respective drawings may not coincide with one another. In addition, conditions, such as materials and dimensions, specifically shown in the following embodiments are examples only.

Note that in the following embodiments, "first transistor" refers to an N-channel MOS transistor (hereinafter described as "NMOS" in some cases) formed in a peripheral circuit region, "Second transistor" refers to a P-channel MOS transistor (hereinafter described as "PMOS" in some cases) formed in the peripheral circuit region. "Third transistor" refers to a transistor formed in a memory cell region.

"First wiring" and "second wiring" respectively refer to first gate electrode 17a formed on P well 3 and second gate electrode 17b formed on N well 4 in the peripheral circuit region. "First well" and "second well" respectively refer to a P well and an N well. "First conductive film" refers to first metal film 7a and impurity-containing polysilicon film 8a formed on P well 3 of the peripheral circuit region (see, for example, FIG. 15). "Second conductive film" refers to first metal film 7b and impurity-containing polysilicon film 8b formed on N well 4 of the peripheral circuit region (see, for example, FIG. 15). "Third conductive film" refers to impurity-containing polysilicon film 11 and second metal film 12 (see, for example, FIG. 16).

First Exemplary Embodiment

1. Semiconductor Device

The present exemplary embodiment relates to a DRAM (Dynamic Random Access Memory) which is a semiconductor device to which a structure of the present invention is applied.

Figure 2:
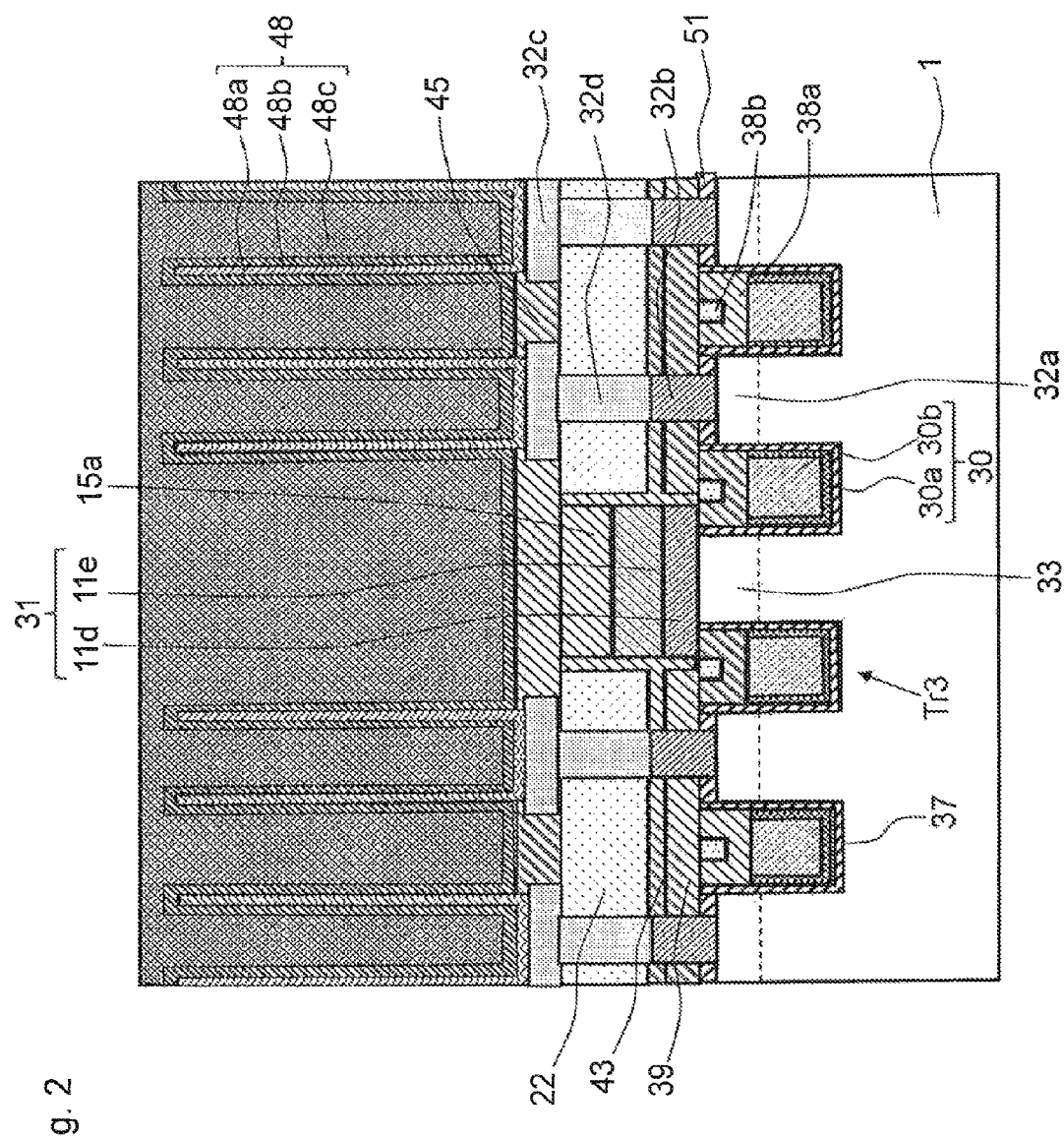
FIG. 2 is a cross-sectional view illustrating a semiconductor device according to the first exemplary embodiment.
Figure 3:
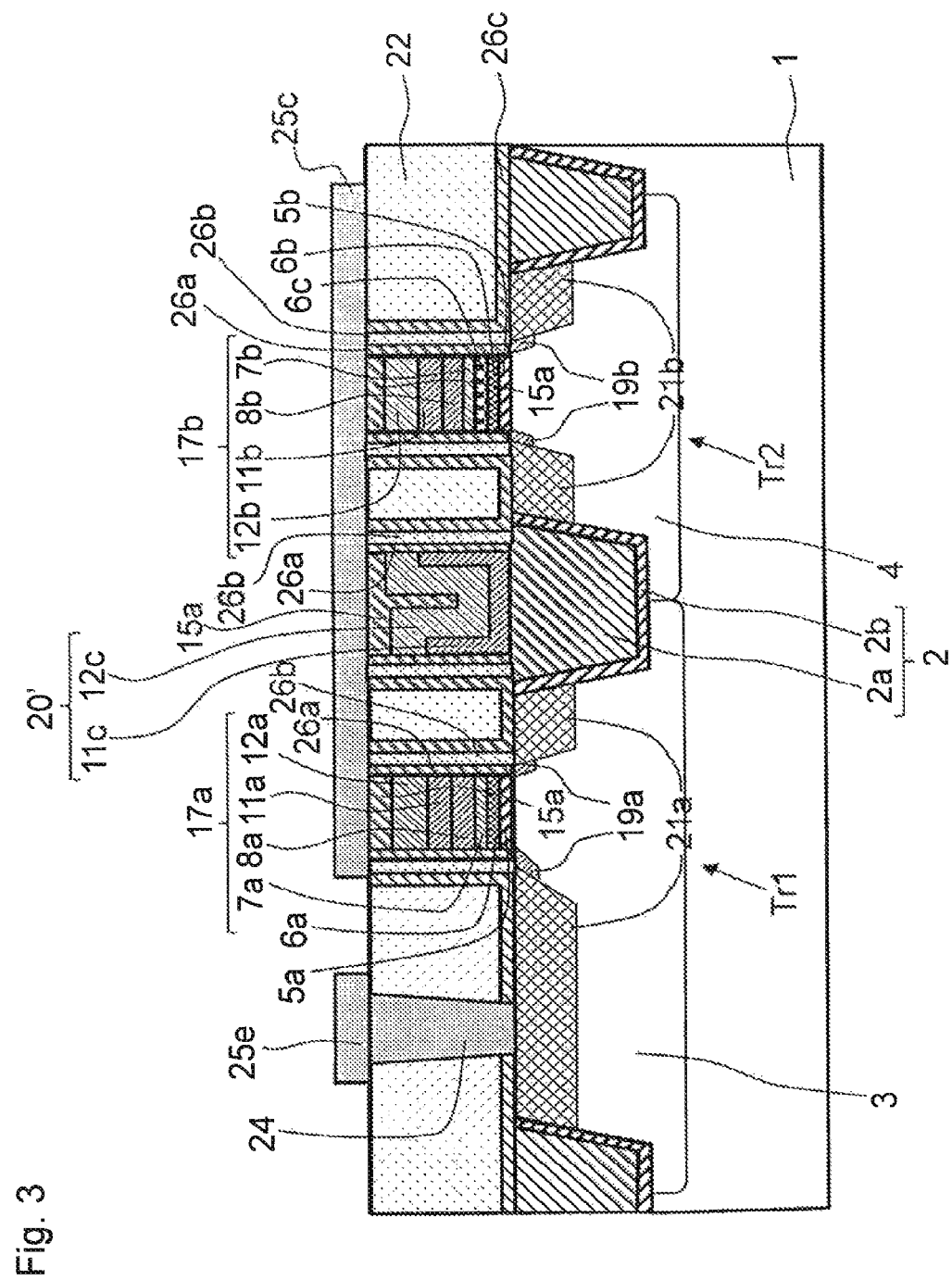
FIG. 3 is a cross-sectional view illustrating a semiconductor device according to the first exemplary embodiment.

FIGS. 1 to 3 are schematic views illustrating the semiconductor device of the present exemplary embodiment, where FIG. 1A is a plan view of a memory cell region, FIG. 1B is a plan view of a peripheral circuit region, FIG. 2 is a cross-sectional view taken along the A-A' direction of FIG. 1A, and FIG. 3 is a cross-sectional view taken along the A-A' direction of FIG. 1B. Note that the plan views of FIG. 1 represent only major structures of the semiconductor device.

The DRAM of the present exemplary embodiment is composed of the memory cell region illustrated in FIG. 1A and the peripheral circuit region illustrated in FIG. 1B, and has a 6F2 cell layout (F denotes a minimum is processing size).

(Memory Cell Region)

As illustrated in FIG. 1A, a plurality of isolation regions (STI) 2 and a plurality of active regions 1a are alternately formed at predetermined intervals in a Y direction in the memory cell region of the DRAM. Isolation regions 2 and active regions 1a extend in an X' direction shown in FIG. 1A. In addition, buried gate electrodes 30 to serve as word lines and dummy word lines 30' extend in a Y direction, so as to come across active regions 1a. Buried gate electrodes 30 and dummy word lines 30' are formed as the result of being buried in semiconductor substrate 1 at predetermined intervals in an X direction. Yet additionally, a plurality of bit lines 31 is disposed at predetermined intervals in the X direction orthogonal to word lines 30 and dummy word lines 30'. A memory cell is formed in a region in which word line 30 and active region 1a intersect with each other. Each memory cell is composed of third transistor Tr3 and an unillustrated capacitor. Third transistor Tr3 is composed of capacitor contact region 32a and bit contact region 33 to serve as a third source and drain, word line 30, and an unillustrated third gate insulating film.

Word lines 30 and dummy word lines 30' are the same in structure but different in functionality. Whereas each word line 30 is used as the gate electrode of third transistor Tr3, dummy word line 30' is provided in order to isolate adjacent third transistors Tr3 from each other by applying a predetermined potential. That is, third transistors adjacent to each other on the same active region 1a are isolated from each other by maintaining dummy word line 30' at a predetermined potential and thereby turning off parasitic transistors. In addition, a plurality of memory cells are formed in the memory cell region as a whole, and a capacitor (not illustrated in FIG. 1A) is provided in each memory cell. Each capacitor is electrically connected to capacitor contact region 32a through capacitor contact plugs 32b and 32d electrically connected to capacitor contact region 32a of each transistor and through capacitor contact pad 32c electrically connected to capacitor contact plugs 32b and 32d. As illustrated in FIG. 1A, capacitor contact plugs 32b and 32d are disposed at predetermined intervals within the memory cell region, so as not to overlap with each other. In addition, each memory cell is connected to bit line 31 through bit contact region 33.

As illustrated in FIG. 2, each memory cell is formed of third transistor Tr3 and capacitor 48 in the memory cell region. Third transistor Tr3 is composed of word line 30 formed of a buried gate electrode buried in semiconductor substrate 1, third gate insulating film 37 disposed between semiconductor substrate 1 and word line 30, and capacitor contact region 32a and bit contact region 33 disposed on the principal surface of semiconductor substrate 1 to serve as a third source and drain. Each word line 30 is composed of, for example, barrier metal film 30a made of a titanium nitride film and metal gate film 30b made of a tungsten film. Each word line 30 is formed so that the upper surface thereof is lower than the upper surface of semiconductor substrate 1. Liner film 38a made of a silicon nitride film and SOD (Spin on Dielectric) film 38b are disposed on each word line 30.

Bit contact interlayer insulating film 39 made of a silicon nitride film is disposed on semiconductor substrate 1. A portion of bit contact interlayer insulating film 39 on bit contact region 33 is open, and bit line 31 is disposed in the portion, so as to contact with bit contact region 33. Bit line 31 is composed of, for example, impurity-containing polysilicon film 11d and laminated film 11e made of a tungsten nitride film and a tungsten film, in order from the side nearest to semiconductor substrate 1. Buried insulating film 15a made of a silicon nitride film is disposed on bit line 31. Liner film 43 made of a silicon nitride film is disposed on bit contact interlayer insulating film 39 and on the side surfaces of bit line 31 and buried insulating film 15a. SOD film (interlayer insulating film) 22 is disposed on liner film 43.

Capacitor contact plugs 32b and 32d are disposed so as to penetrate through SOD film 22, liner film 43 and bit contact interlayer insulating film 39 and connect to capacitor contact region 32a. Capacitor contact pad 32c is further disposed on SOD film 22, so as to connect to capacitor contact plugs 32b and 32d. Stopper film 45 made of a silicon nitride film and an interlayer insulating film (not illustrated) are disposed on SOD film 22, so as to cover capacitor contact pad 32c. In addition, capacitor 48 is disposed so as to electrically connect to capacitor contact pad 32c. Capacitor 48 is electrically connected to capacitor contact region 32a through capacitor contact plugs 32b and 32d and capacitor contact pad 32c. Note that capacitor contact pad 32c may not be formed. In that case, capacitor 48 is formed on capacitor contact plug 32d as appropriate. Capacitor 48 is formed as the result of lower electrode 48a, capacitor insulating film 48b and upper electrode 48c being laminated in this order.

(Peripheral Circuit Region)

As illustrated in FIG. 1B, region Cn for forming an NMOS is formed and region Cp for forming a PMOS is formed are disposed in the peripheral circuit region. Regions Cn and Cp are disposed so as to sandwich an unillustrated isolation region (STI) therebetween. Active regions 1a in which surfaces of semiconductor substrate 1 are exposed are disposed in regions Cn and Cp, and first gate electrode (first wiring) 17a and second gate electrode (second wiring) 17b formed simultaneously with the formation of bit lines 31 of the memory cell region are disposed so as to halve respective active regions 1a. In region Cn, a high-concentration impurity is introduced into active regions 1a on both sides of first gate electrode 17a to convert the active regions into first source and drain 21a. Likewise, in region Cp, a high-concentration impurity is introduced into active regions 1a on both sides of second gate electrode 17b to convert the active regions into second source and drain 21b. First gate electrode 17a, first source and drain 21a, and an unillustrated first gate insulating film formed on region Cn constitute first transistor Tr1 in the peripheral circuit region. Likewise, second gate electrode 17b, second source and drain 21b, and an unillustrated second gate insulating film formed on region Cp constitute second transistor Tr2 in the peripheral circuit region. First source and drain 21a is connected to fifth wiring 25e through contact plug 24.

Third wiring 20' is formed on the isolation region. A seam is present in the upper portion of third wiring 20', thus causing the wiring to be concave-shaped. An unillustrated buried insulating film is disposed on third wiring 20, so as to fill the seam (concave portion). Fourth wirings 25c and 25d are disposed on the buried insulating film. Third wiring 20 and fourth wirings 25c and 25d are isolated from each other through the buried insulating film disposed on third wiring 20'. Consequently, it is possible to prevent fourth wirings 25c and 25d from short-circuiting to each other through third wiring 20' to degrade device characteristics.

As illustrated in FIG. 3, the peripheral circuit region of the semiconductor device of the present exemplary embodiment includes P well 3 and N well 4. Isolation region 2 is disposed between P well 3 and N well 4 to insulate and separate P well 3 and N well 4 from each other. Isolation region 2 is composed of a laminated film made of silicon oxide film 2b and silicon nitride film 2a. Silicon oxide film 5a and hafnium oxide film (first high-dielectric insulating film) 6a serving as first gate insulating films are disposed on P well 3 in this order. Titanium nitride film (first metal film) 7a, impurity-containing polysilicon films 8a and 11a, and first gate electrode (first wiring) 17a composed of laminated film (second metal film) 12a made of a tungsten nitride film and a tungsten film are disposed on the first gate insulating films. Silicon oxide film 5b, hafnium oxide film (first high-dielectric insulating film) 6b, and aluminum oxide film (second high-dielectric insulating film) 6c serving as second gate insulating films are disposed on N well 4 in this order. Titanium nitride film (first metal film) 7b, impurity-containing polysilicon films 8b and 11 b, and second gate electrode 17b composed of laminated film (second metal film) 12b made of a tungsten nitride film and a tungsten film are disposed on the second gate insulating films. Buried insulating films 15a are disposed on first and second gate electrodes 17a and 17b.

Concave third wiring 20' is formed on isolation region 2. Third wiring 20' is composed of impurity-containing polysilicon film 11c and laminated film (second metal film) 12c made of a tungsten nitride film and a tungsten film, where the upper portion of third wiring 20' is concave-shaped. Buried insulating film 15a superior in coverage (step coverage) is disposed so as to fill the concave portion of third wiring 20'. Offset spacer 26a made of a silicon nitride film, sidewall spacer 26b made of a silicon oxide film, and liner film 26c made of a silicon nitride film are disposed in order on the side surfaces of first gate electrodes 17a, second gate electrodes 17b, and third wiring 20, respectively.

LDD regions 19a of the N conductivity type and first source and drain 21a of the N conductivity type are respectively formed on both sides of first gate electrode 17a within P well 3. LDD regions 19b of the P conductivity type and second source and drain 21b of the P conductivity type are respectively formed on both sides of second gate electrode 17b within N well 4. P well 3, first gate insulating films 5a and 6a, first gate electrode 17a, LDD regions 19a of the N conductivity type, and first source and drain 21a constitute the NMOS which is first transistor Tr1. In addition, N well 4, second gate insulating films 5b, 6b and 6c, second gate electrode 17b, LDD regions 19b of the P conductivity type, and second source and drain 21b constitute the PMOS which is second transistor Tr2.

SOD film (interlayer insulating film) 22 is disposed on semiconductor substrate 1 within the peripheral circuit region. Contact plug 24 is disposed so as to penetrate through SOD film 22 and connect to first source and drain 21a. Fifth wiring 25e is disposed on SOD film 22, so as to contact with contact plug 24, and fourth wiring 25c is disposed so as to contact with buried insulating film 15a on third wiring 20.

2. Method for Manufacturing Semiconductor Device

Hereinafter, a method for manufacturing a semiconductor device of the present exemplary embodiment will be described with reference to FIGS. 1 to 23. Note that in FIGS. 4 to 11, 16 to 19 and 22 to 24, each view A represents a cross-sectional view corresponding to the A-A' direction of the memory cell region in FIG. 1A, whereas each view B represents a cross-sectional view corresponding to the A-A direction of the peripheral circuit region in FIG. 1B. FIGS. 12 to 15 and 20 to 21 represent cross-sectional views corresponding to the A-A' direction of the peripheral circuit region in FIG. 1B.

Figure 4:
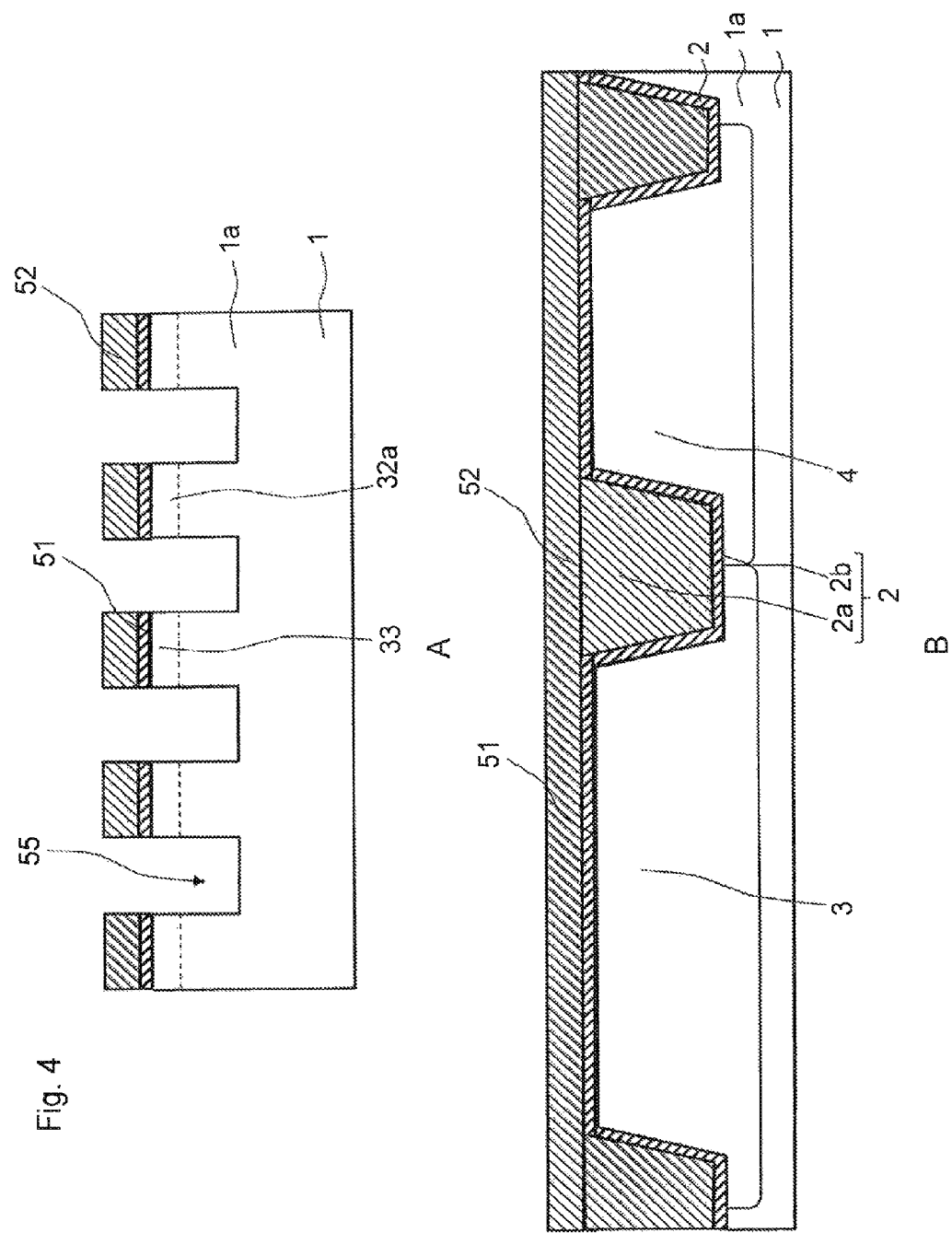
FIG. 4 illustrates a method of manufacturing a semiconductor device according to the first exemplary embodiment.

First, as illustrated in FIG. 4, isolation region (STI) 2 composed of a laminated film made of silicon oxide film 2b and silicon nitride film 2a is formed in the memory cell region and the peripheral circuit region within semiconductor substrate 1 (the isolation region is not illustrated in FIG. 4A). Consequently, active region 1a divided off by isolation region 2 is defined in the memory cell region and the peripheral circuit region. In addition, P well 3 and N well 4 are formed within active region 1a by a heretofore-known method. An impurity is implanted into semiconductor substrate 1 in the memory cell region to form an impurity-diffused layer. Subsequently, the principal surface of semiconductor substrate 1 is thermally oxidized to form silicon oxide film 51, and silicon nitride film 52 is formed on silicon oxide film 51. Silicon oxide film 51 and silicon nitride film 52 on the memory cell region are patterned to provide a hard mask pattern. Groove-like trench 55 extending in a direction intersecting with the isolation region is formed in semiconductor substrate 1 by etching using the hard mask pattern. This formation of trench 55 splits the previously-formed impurity-diffused layer into capacitor contact region 32a and bit contact region 33 which are a third source and drain.

Figure 5:
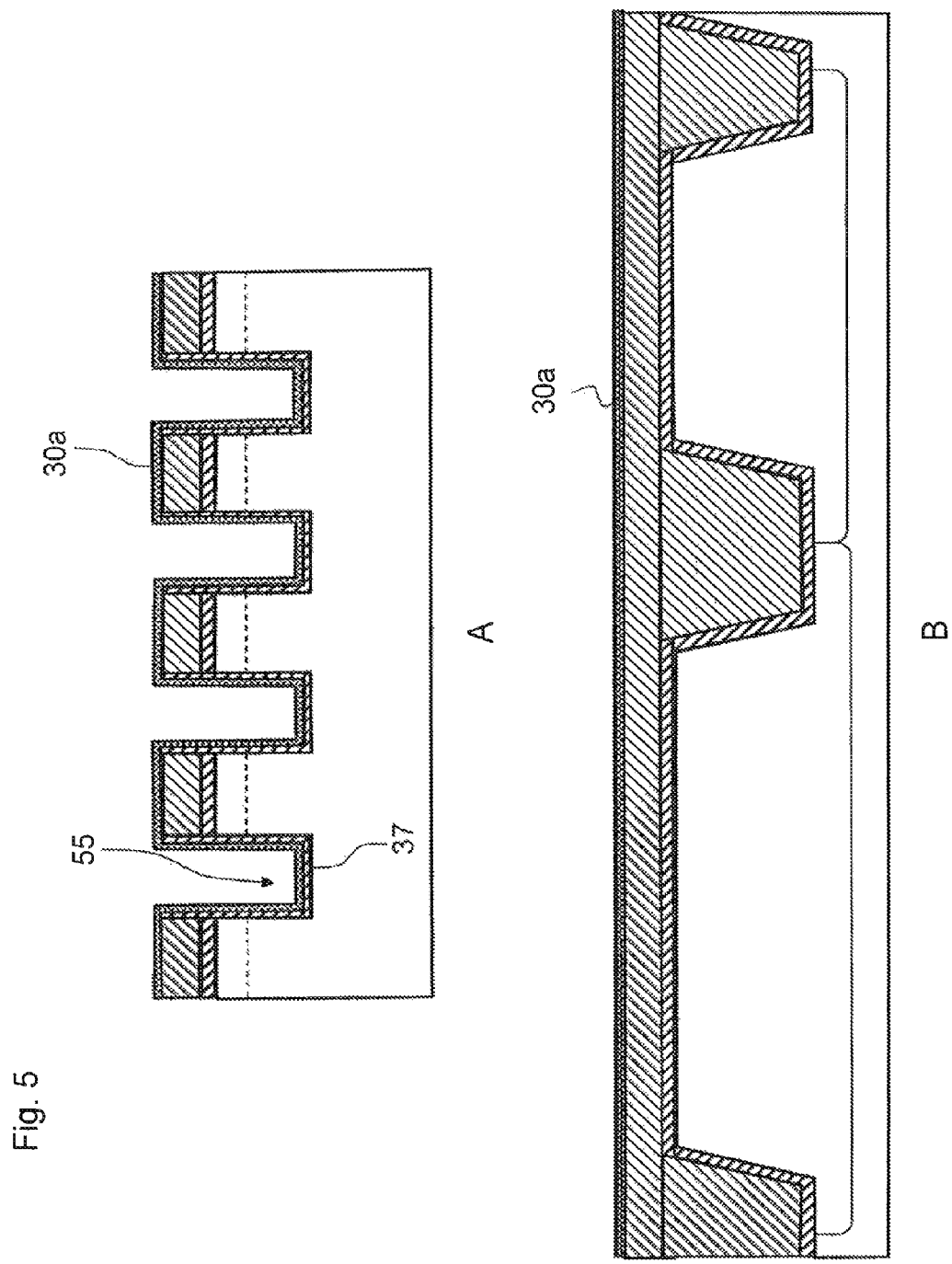
FIG. 5 illustrates a method of manufacturing a semiconductor device according to the first exemplary embodiment.

As illustrated in FIG. 5, the inner walls of trench 55 are oxidized by an ISSG (in-situ steam generation) method to form third gate insulating film 37 made of a silicon oxide film. Next, barrier film 30a, such as a titanium nitride film, is formed on the inner walls of trench 55.

Figure 6:
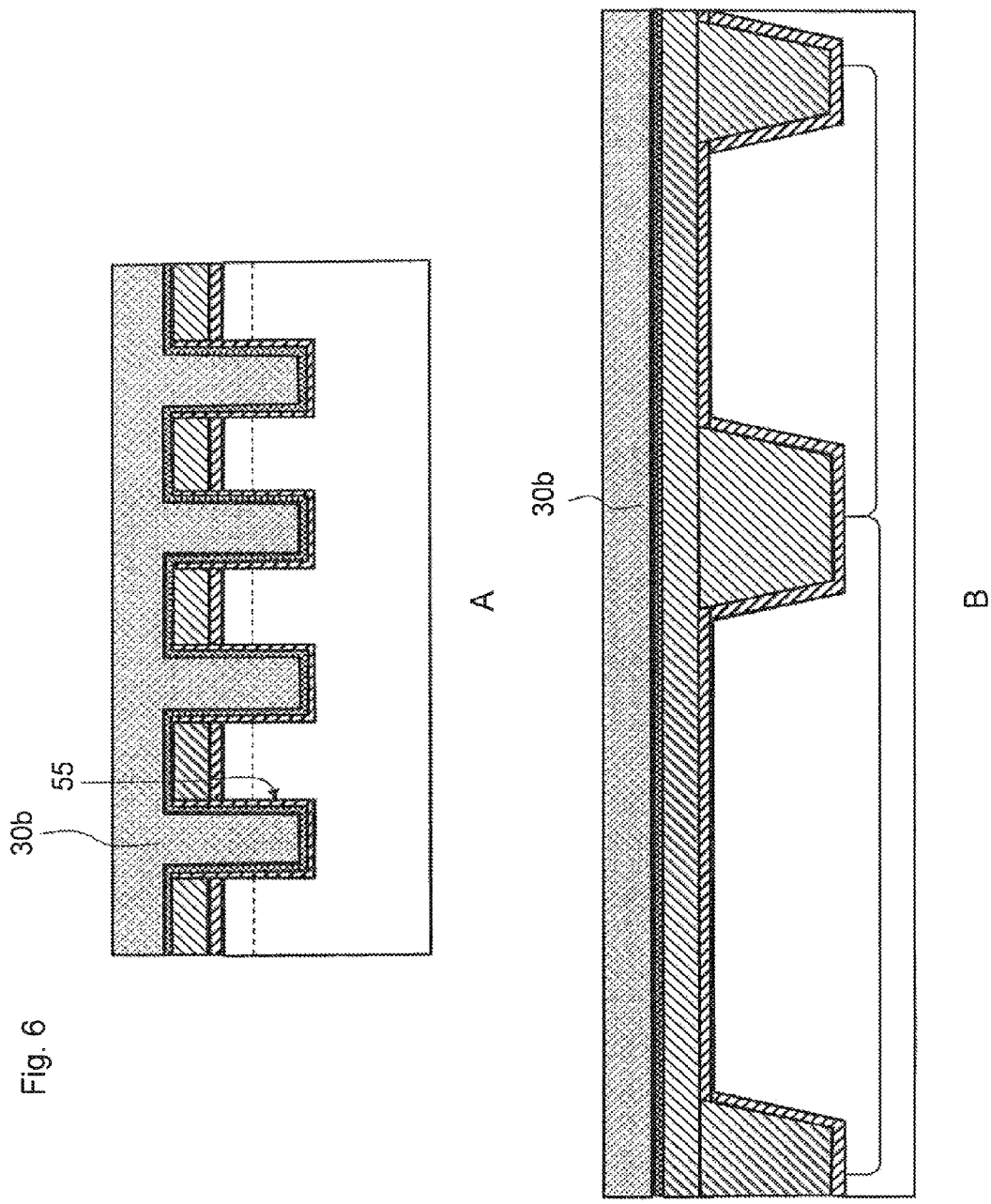
FIG. 6 illustrates a method of manufacturing a semiconductor device according to the first exemplary embodiment.

As illustrated in FIG. 6, trench 55 is filled with metal gate film 30b, such as a tungsten film.

Figure 7:
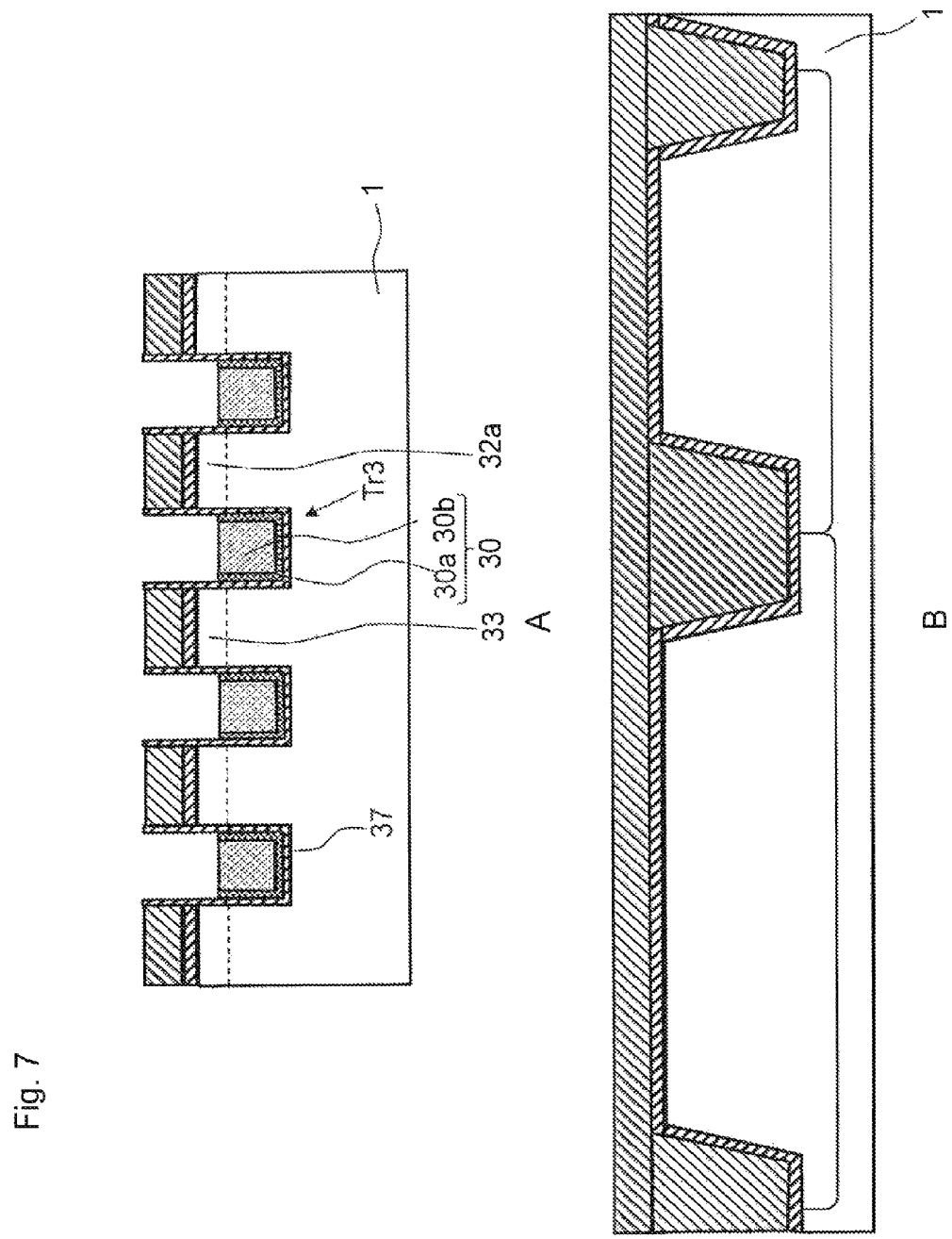
FIG. 7 illustrates a method of manufacturing a semiconductor device according to the first exemplary embodiment.

As illustrated in FIG. 7, the upper surfaces of barrier film 30a and metal gate film 30b are backed away from the principal surface of semiconductor substrate 1 by etch-back to form word line (buried gate electrode) 30. Consequently, there are formed capacitor contact region 32a and bit contact region 33 to serve as a third source and drain, third gate insulating film 37, and third transistor Tr3 including word line (buried gate electrode) 30.

Figure 8:
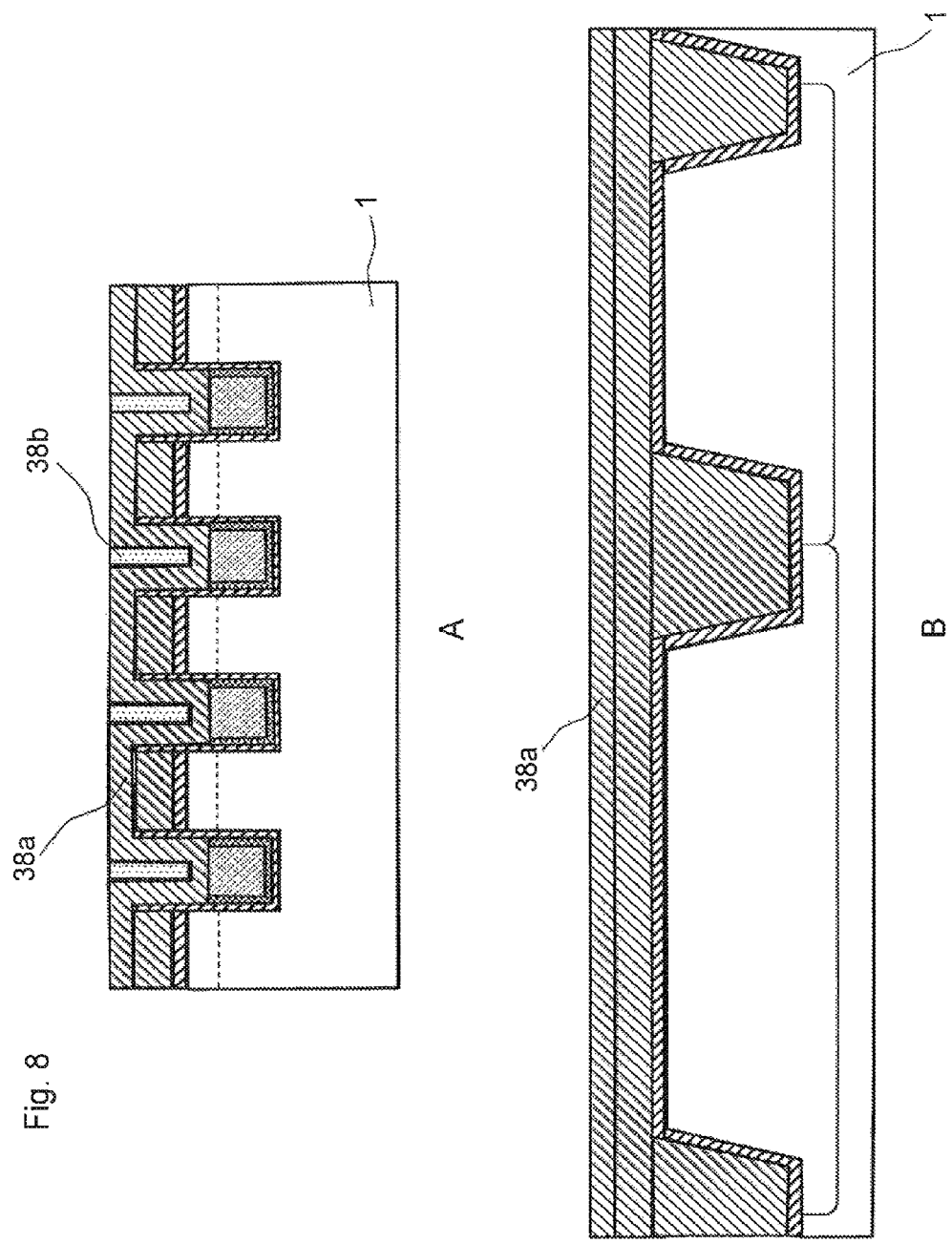
FIG. 8 illustrates a method of manufacturing a semiconductor device according to the first exemplary embodiment.

As illustrated in FIG. 8, liner film 38a made of a silicon nitride film is formed on the entire surface of semiconductor substrate 1, and then SOD film 38b is further formed thereon. Thereafter, a CMP treatment is performed on SOD film 38b until the upper surface of liner film 38a is exposed.

Figure 9:
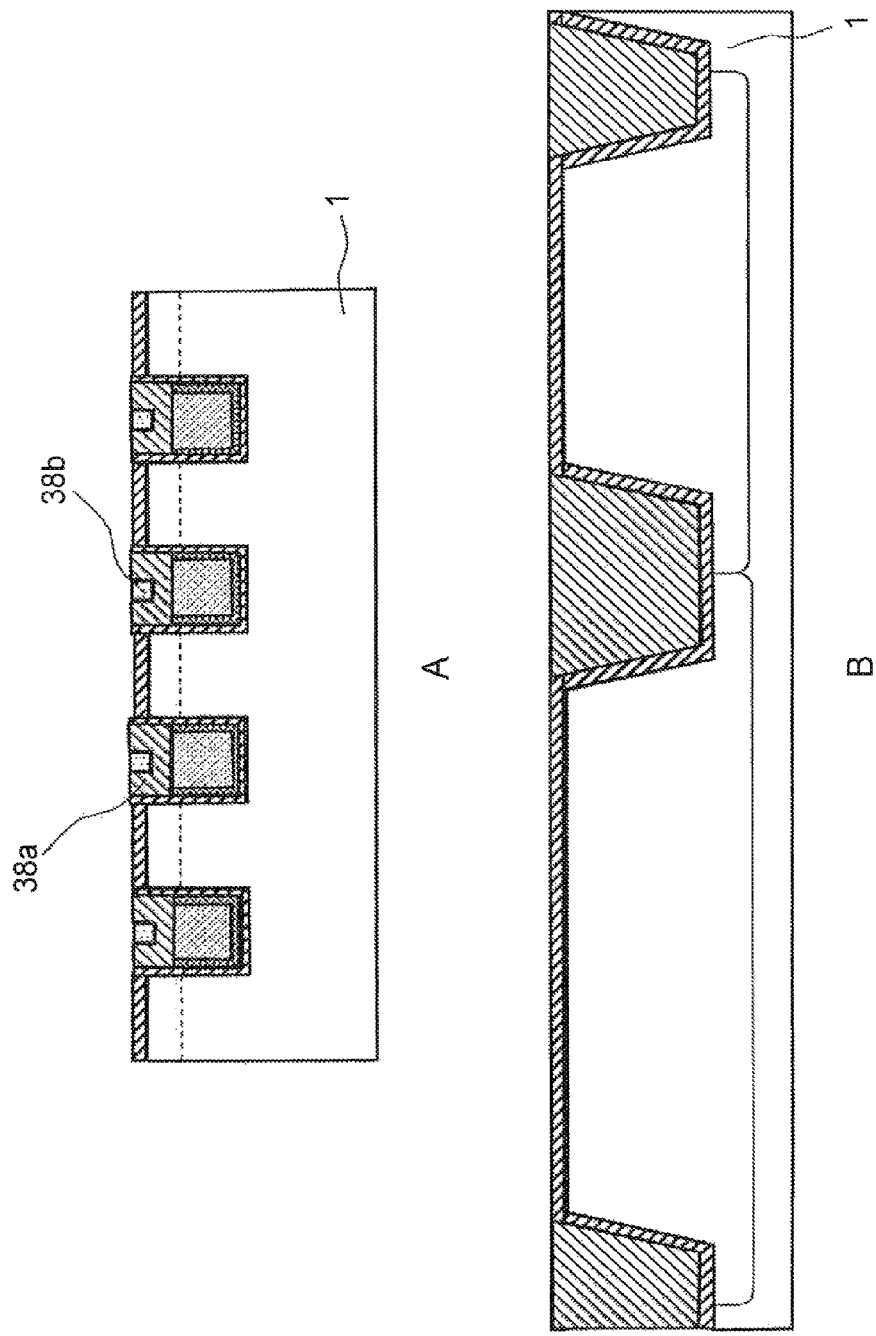
FIG. 9 illustrates a method of manufacturing a semiconductor device according to the first exemplary embodiment.

As illustrated in FIG. 9, upper portions of liner film 38a and SOD film 38b are removed by dry etching. Next, silicon nitride film 52 is removed by dry etching.

Figure 10:
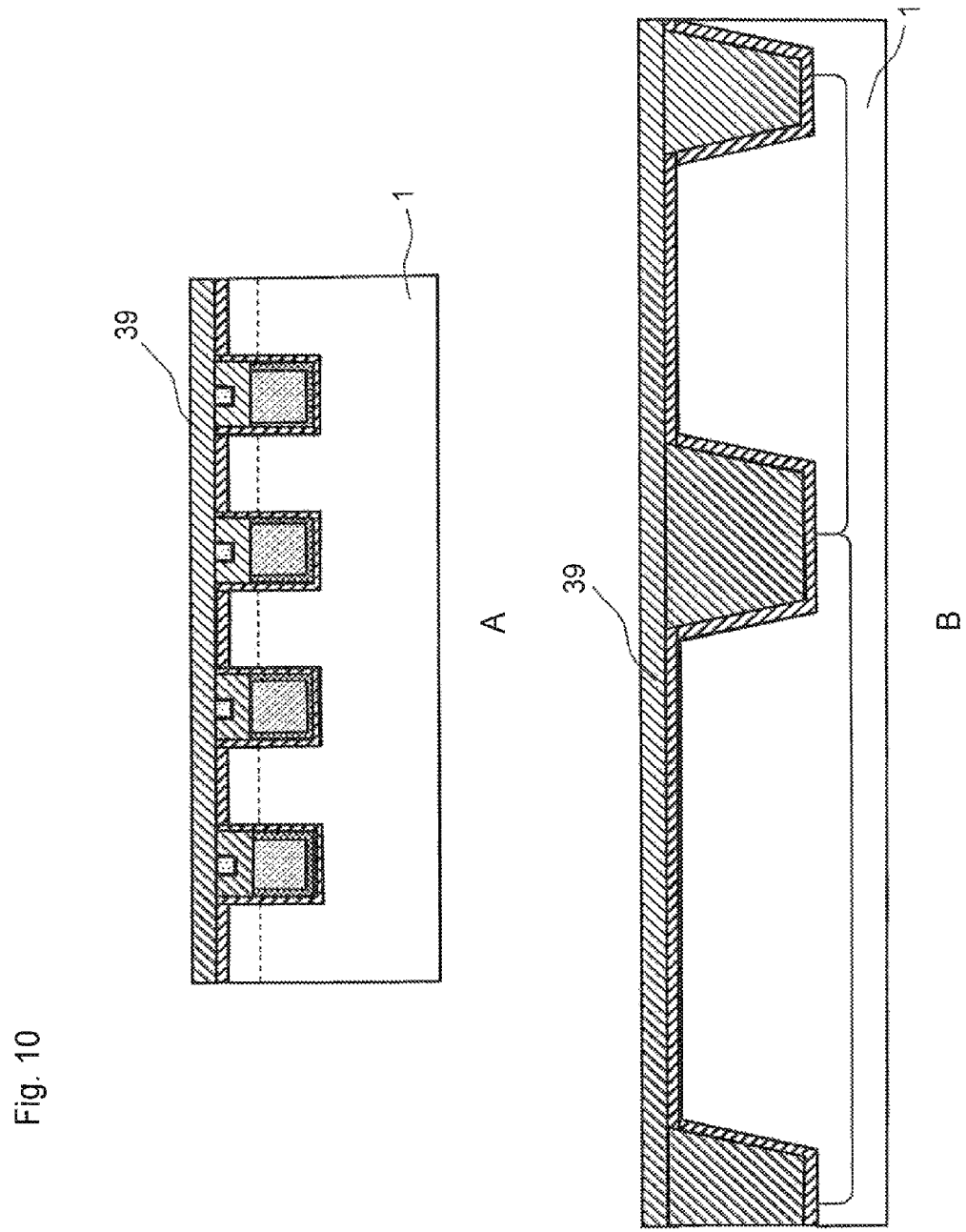
FIG. 10 illustrates a method of manufacturing a semiconductor device according to the first exemplary embodiment.

As illustrated in FIG. 10, bit contact interlayer insulating film 39 made of a silicon nitride film is formed on the entire surface of semiconductor substrate 1.

Figure 11:
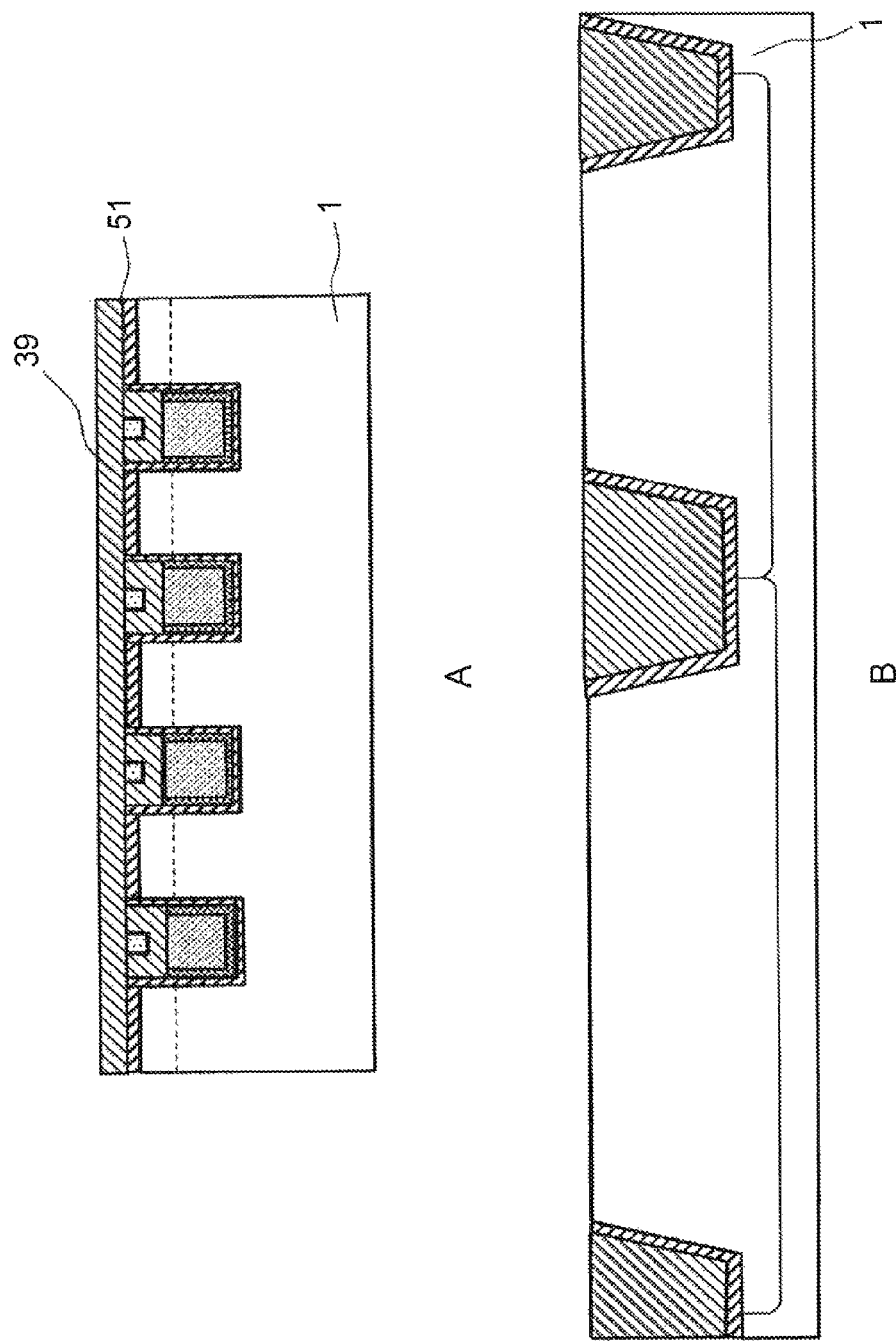
FIG. 11 illustrates a method of manufacturing a semiconductor device according to the first exemplary embodiment.

As illustrated in FIG. 11, bit contact interlayer insulating film 39 and silicon oxide film 51 deposited in the peripheral circuit region are removed in order using photolithographic and etching methods to expose the principal surface of semiconductor substrate 1.

Figure 12:
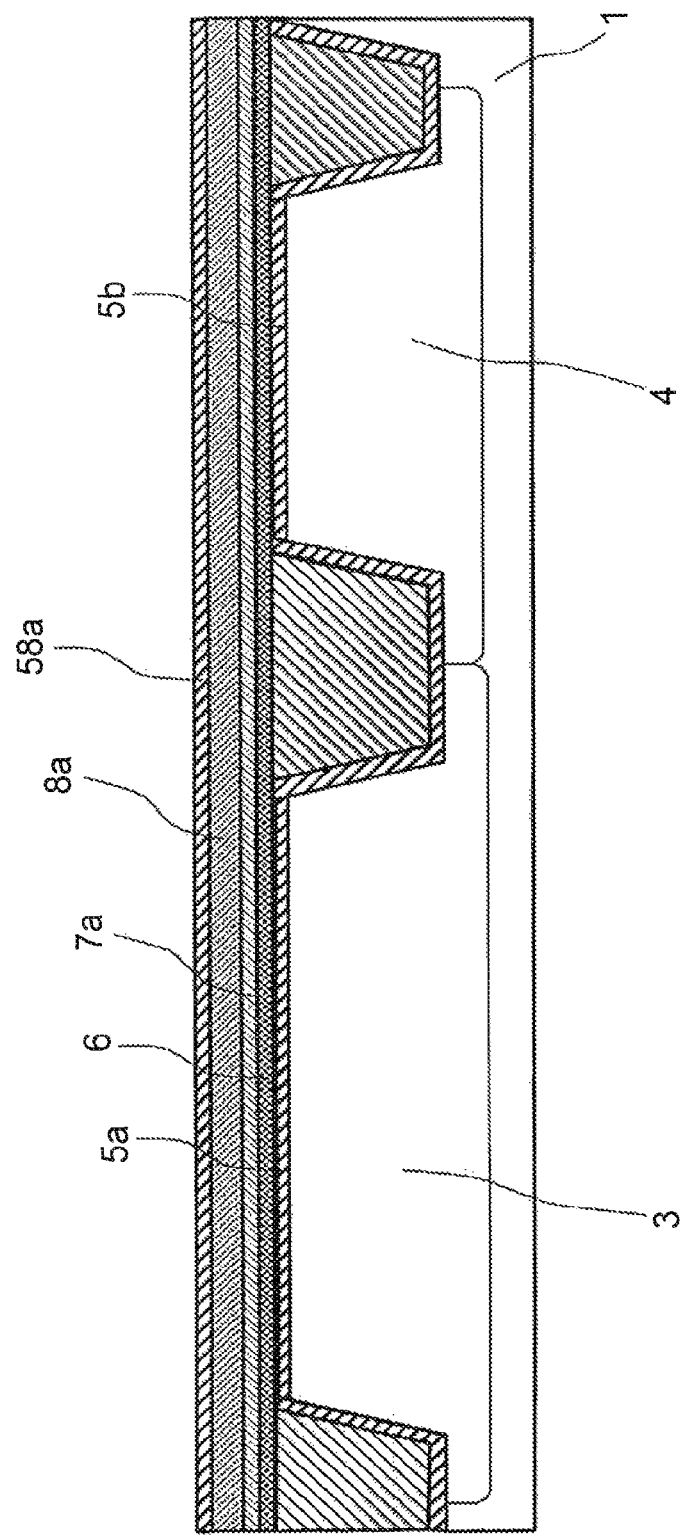
FIG. 12 illustrates a method of manufacturing a semiconductor device according to the first exemplary embodiment.

Next, as illustrated in FIG. 12, the surfaces of P well 3 and N well 4 in the peripheral circuit region are thermally oxidized to form silicon oxide films 5a and 5b, respectively. Hafnium oxide film (first high-dielectric insulating film) 6 is formed on the entire surface of semiconductor substrate 1 by an ALD or CVD method. Thereafter, titanium nitride film (first metal film) 7a, impurity-containing polysilicon film 8a, and silicon oxide film 58a are formed on the entire surface of semiconductor substrate 1.

Figure 13:
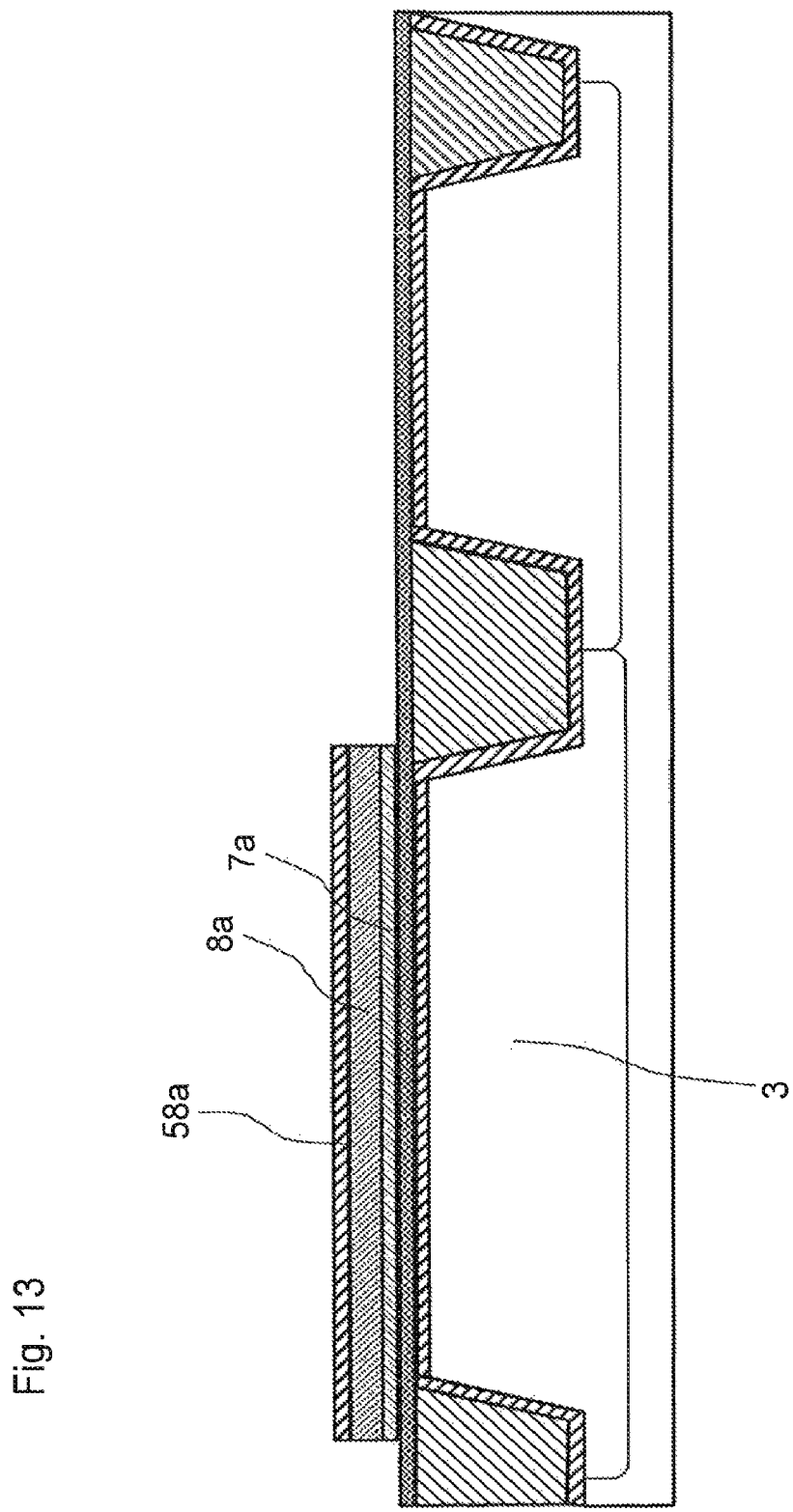
FIG. 13 illustrates a method of manufacturing a semiconductor device according to the first exemplary embodiment.

As illustrated in FIG. 13, silicon oxide film 58a is patterned using lithography and dry etching techniques to form a hard mask made of silicon oxide film 58a, so as to cover P well 3. Polysilicon film 8a and first metal film 7a are dry-etched using hard mask 58a. Consequently, a first conductive film made of first metal film 7a and polysilicon film 8a is disposed on P well 3. At this time, hard mask 58a, polysilicon film 8a, and first metal film 7a deposited in the memory cell region are also removed at the same time.

Figure 14:
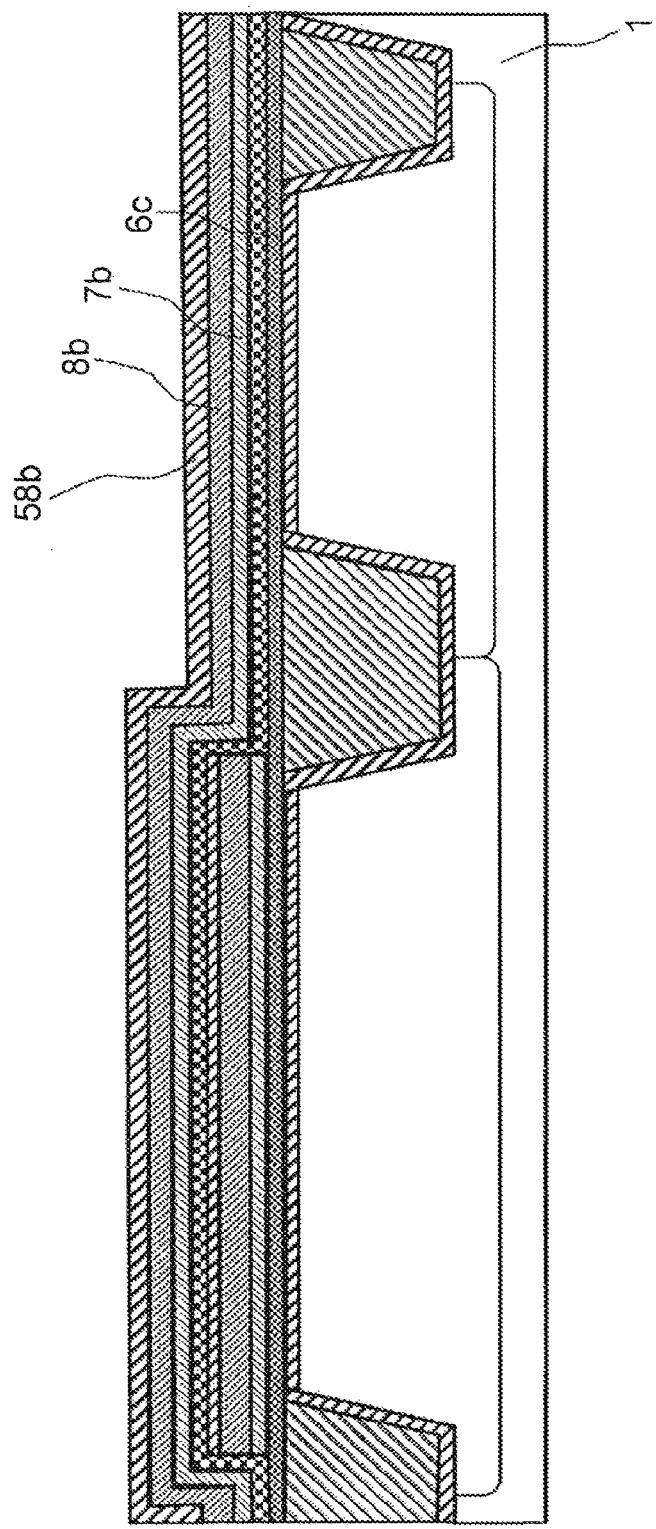
FIG. 14 illustrates a method of manufacturing a semiconductor device according to the first exemplary embodiment.

As illustrated in FIG. 14, aluminum oxide film (second high-dielectric insulating film) 6c is formed on the entire surface of semiconductor substrate 1 by an ALD or PVD method. Thereafter, titanium nitride film (first metal film) 7b, impurity-containing polysilicon film 8b, and silicon oxide film 58b are formed on the entire surface of semiconductor substrate 1.

Figure 15:
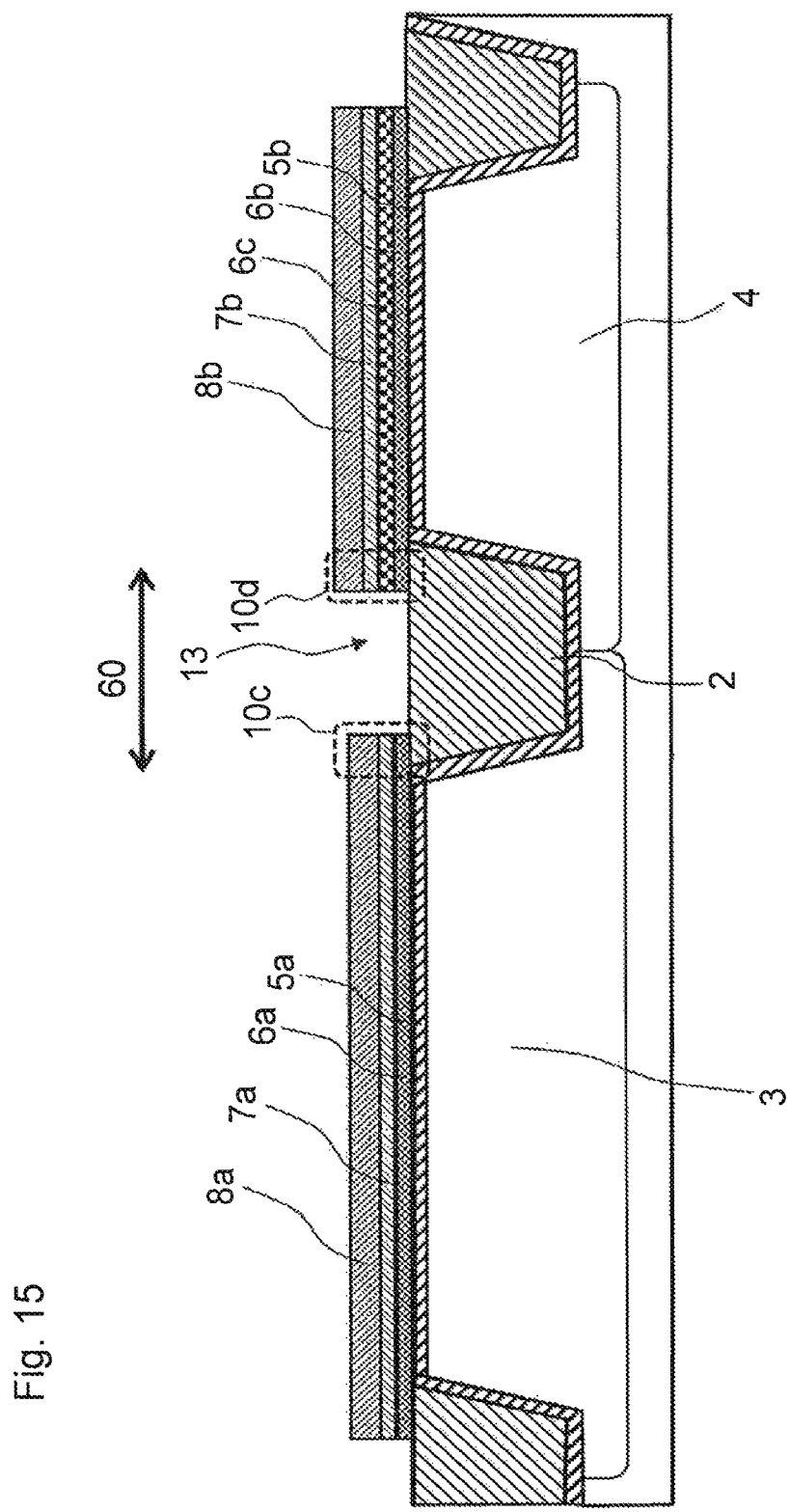
FIG. 15 illustrates a method of manufacturing a semiconductor device according to the first exemplary embodiment.

As illustrated in FIG. 15, silicon oxide film 58b (not illustrated) is patterned using lithography and dry etching techniques to form a hard mask made of silicon oxide film 58b, so as to cover N well 4. Polysilicon film 8b, first metal film 7b, hafnium oxide film 6b, and aluminum oxide film 6c are dry-etched using hard mask 58b. Consequently, silicon oxide film 5b, hafnium oxide film 6b, aluminum oxide film 6c, and a second conductive film made of first metal film 7b and polysilicon film 8b are disposed on N well 4. In addition, silicon oxide film 5a, hafnium oxide film 6a, and the first conductive film made of first metal film 7a and polysilicon film 8a are disposed on P well 3. At this time, silicon oxide film 58b, polysilicon film 8b, first metal film 7b, hafnium oxide film 6b, and aluminum oxide film 6c deposited in the memory cell region are also removed at the same time to expose bit contact interlayer insulating film 39. At this point, one end 10c each of hafnium oxide film 6a and the first conductive film in first direction 60 is positioned on isolation region 2. Likewise, one end 10d each of hafnium oxide film 6b, aluminum oxide film 6c, and the second conductive film in first direction 60 is positioned on isolation region 2. In addition, trench portion 13 is composed of ends 10c and 10d and isolation region 4.

Figure 16:
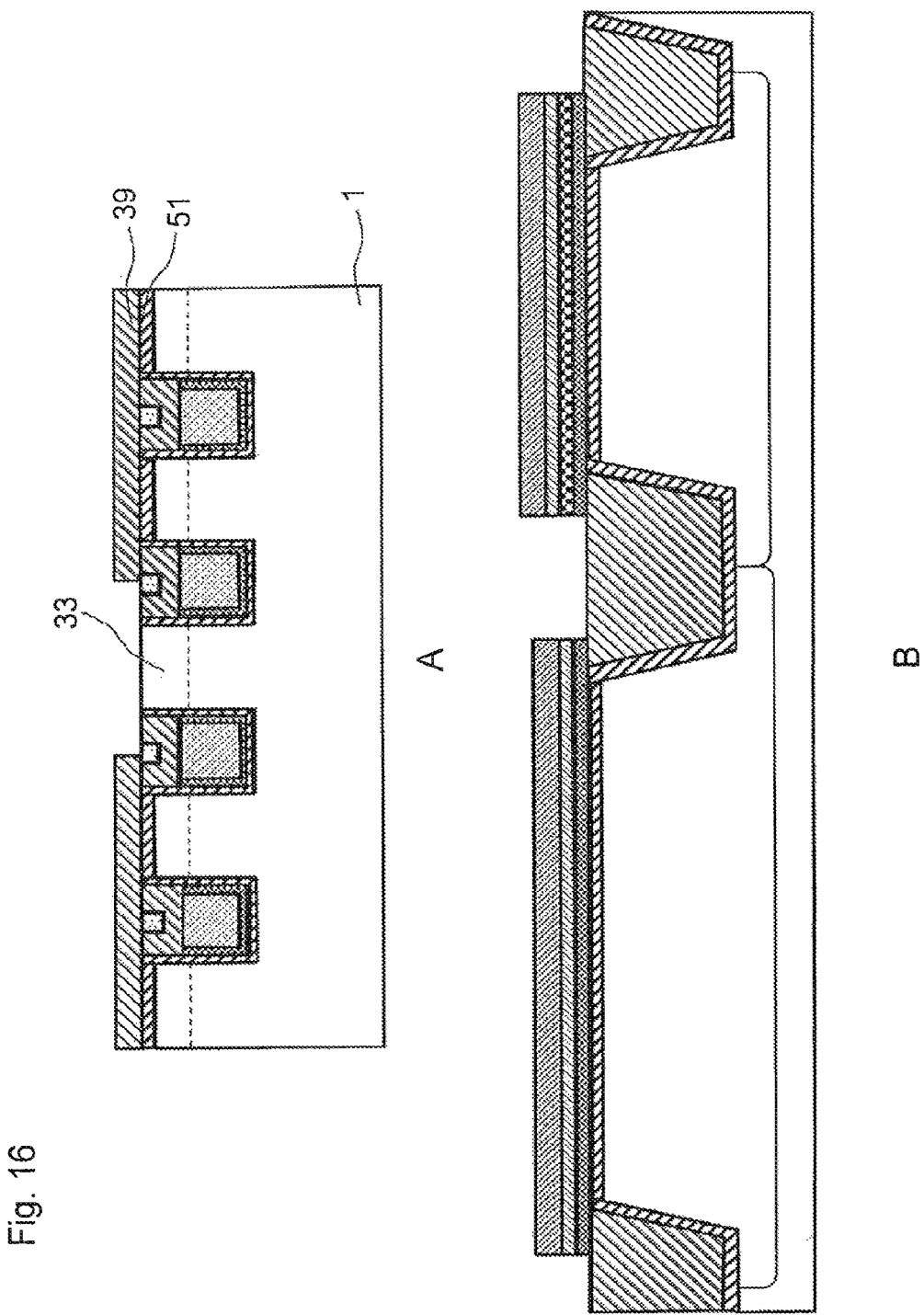
FIG. 16 illustrates a method of manufacturing a semiconductor device according to the first exemplary embodiment.

As illustrated in FIG. 16, portions of bit contact interlayer insulating film 39 and silicon oxide film 51 on bit contact region 33 located in the memory cell region are removed using photolithographic and etching methods to expose bit contact region 33. In addition, hard masks 58a and 58b in the peripheral circuit region are removed by wet etching.

Figure 17:
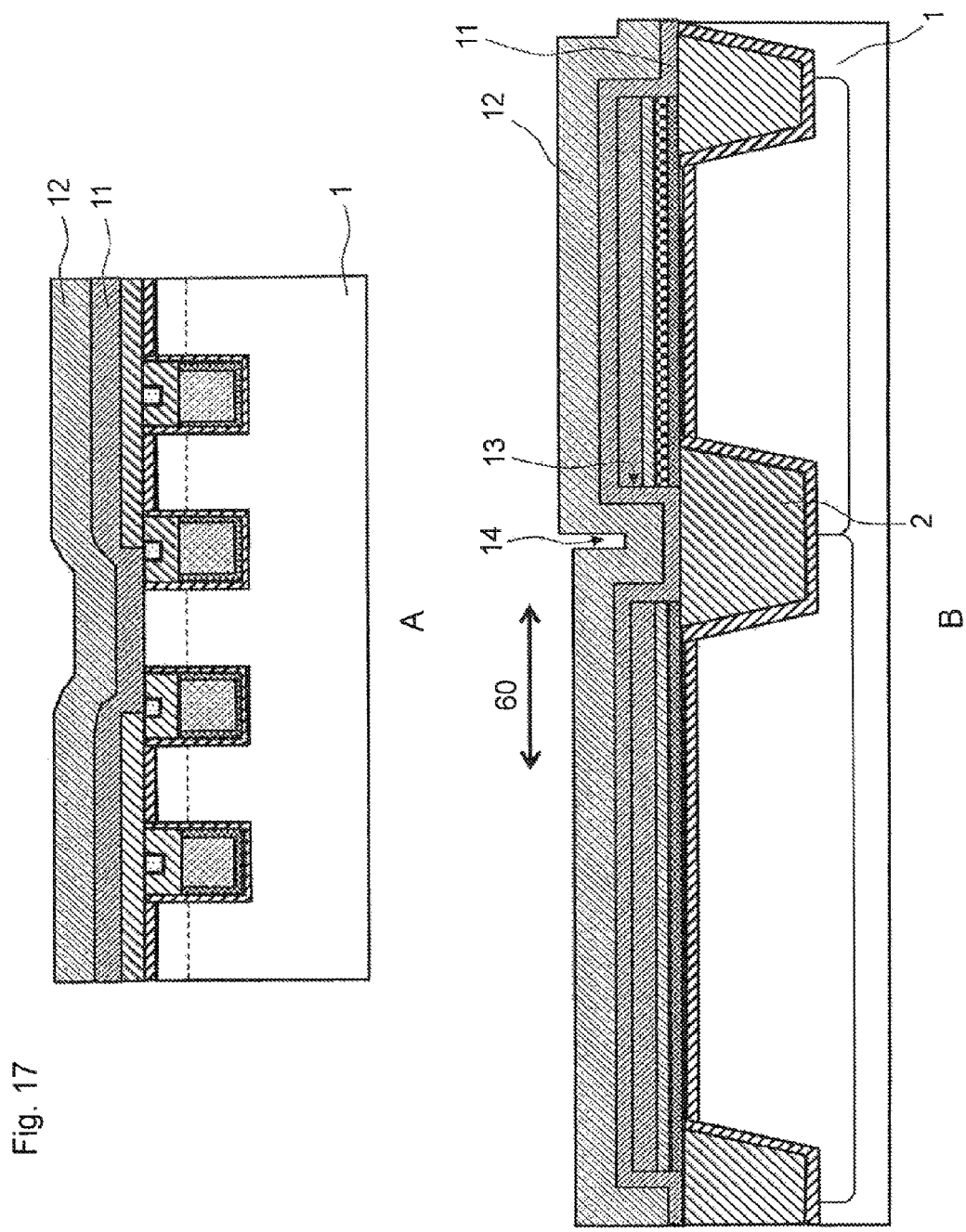
FIG. 17 illustrates a method of manufacturing a semiconductor device according to the first exemplary embodiment.

As illustrated in FIG. 17, impurity-containing polysilicon film 11 and laminated film (second metal film) 12 made of a tungsten nitride film and a tungsten film are formed on the entire surface of semiconductor substrate 1. At this time, polysilicon film 11 and second metal film 12 are formed in the peripheral circuit region, so as to extend from a space on the first conductive film through a space on isolation region 2 to a space on the second conductive film in first direction 60, as illustrated in FIG. 17B. Seam (concave portion) 14 arises above isolation region 2 of the peripheral circuit region since polysilicon film 11 and second metal film 12 are formed within trench portion 13 having high aspect ratio.

Figure 18:
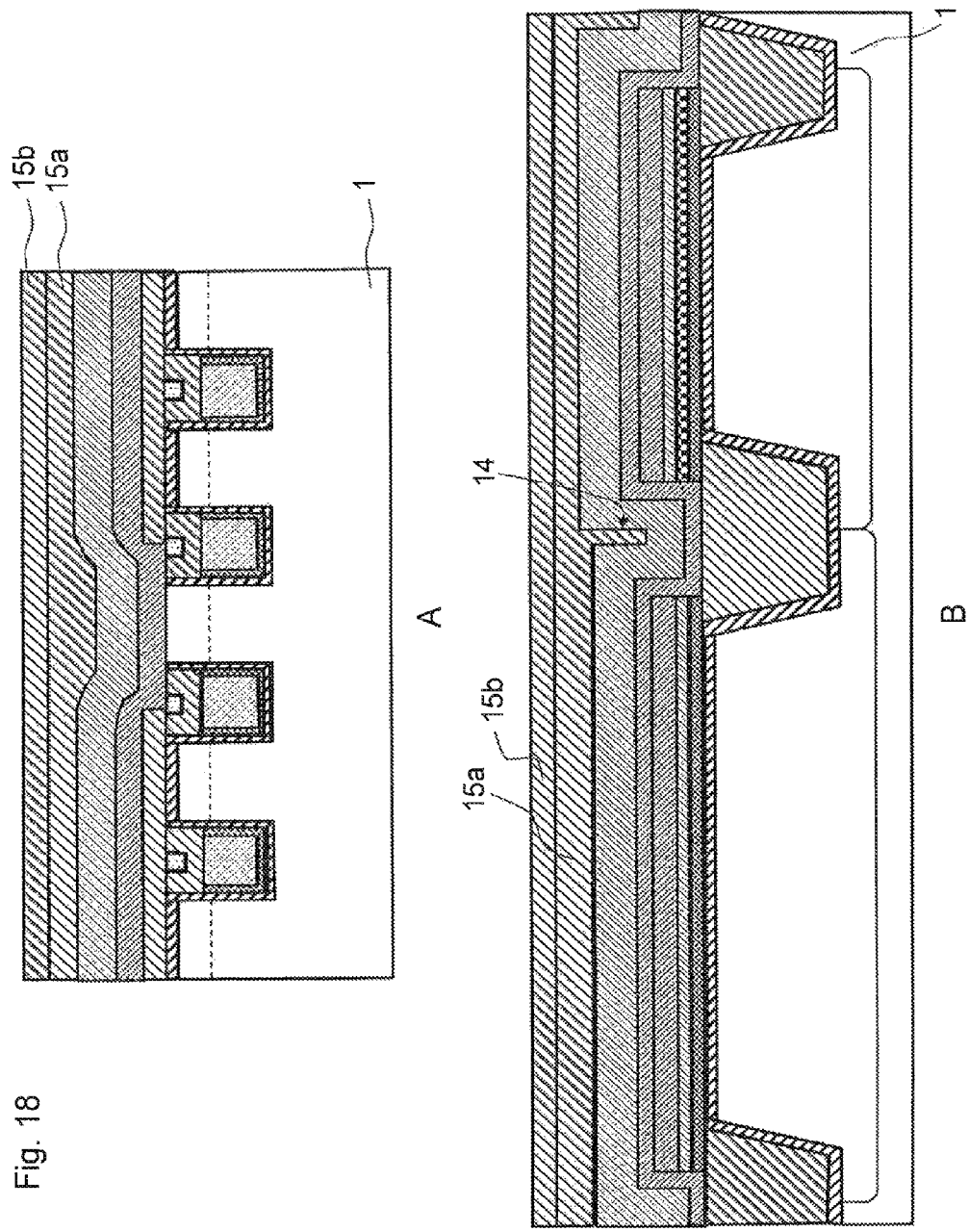
FIG. 18 illustrates a method of manufacturing a semiconductor device according to the first exemplary embodiment.
Figure 19:
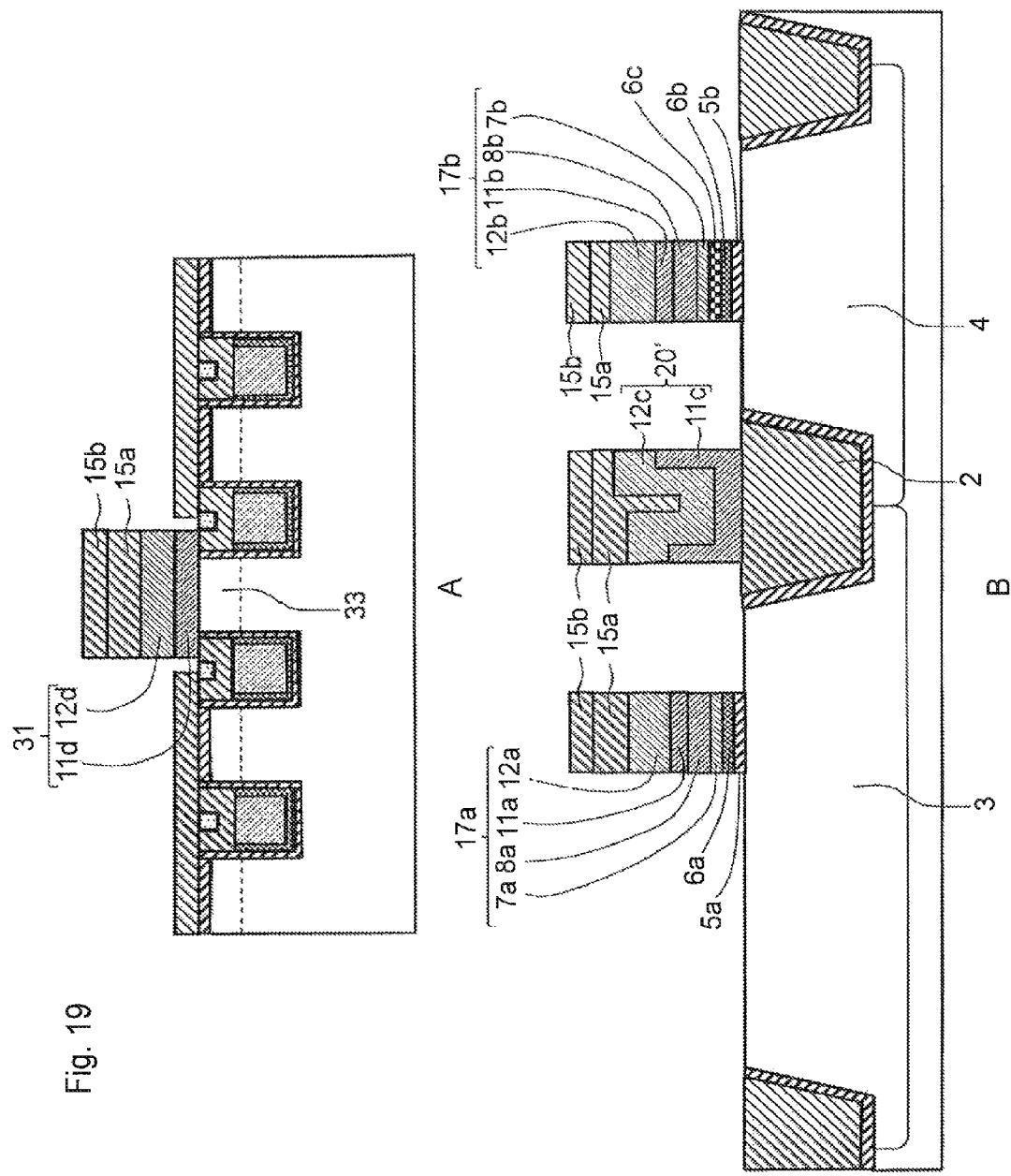
FIG. 19 illustrates a method of manufacturing a semiconductor device according to the first exemplary embodiment.

As illustrated in FIG. 18, silicon nitride film (buried insulating film) 15a is formed on the entire surface of semiconductor substrate 1 by an ALD (Atomic Layer Deposition) method. Since silicon nitride film 15a superior in coverage (step coverage) can be formed in the ALD method, it is possible to fill seam (concave portion) 14 with silicon nitride film 15a. Next, silicon nitride film (second insulating film) 15b is formed on silicon nitride film 15a by a plasma CVD method. Whereas the ALD method is low in the rate of film formation, the plasma CVD method can achieve a high rate of film formation. Accordingly, it is possible to reduce the film-forming time of the silicon nitride films as a whole and improve throughputs, while filling seam 14 with silicon nitride film 15a, by forming silicon nitride film 15b by the plasma CVD method after silicon nitride film 15a is formed by the ALD method.

As illustrated in FIG. 19B, silicon nitride films 15a and 15b are patterned using lithography and dry etching techniques to form hard masks made of silicon nitride films 15a and 15b on P well 3, N well 4 and isolation region 2 in the peripheral circuit region. Second metal film 12, polysilicon films 8a, 8b and 11, first metal films 7a and 7b, hafnium oxide films 6a and 6b, aluminum oxide film 6c, and silicon oxide films 5a and 5b in the peripheral circuit region are dry-etched using the hard masks. Consequently, silicon oxide film 5a and hafnium oxide film 6a are formed on P well 3 as first gate insulating films, and first gate electrode (first wiring) 17a including first metal film 7a, polysilicon films 8a and 11a, and second metal film 12a is also formed on the P well. Likewise, silicon oxide film 5b, hafnium oxide film 6b and aluminum oxide film 6c are formed on N well 4 as second gate insulating films, and second gate electrode (second wiring) 17b including first metal film 7b, polysilicon films 8b and 11 b, and second metal film 12b is also formed on the N well. In addition, third wiring 20' including polysilicon film 11c and second metal film 12c is formed on isolation region 2.

As illustrated in FIG. 19A, silicon nitride films 15a and 15b are patterned in the memory cell region simultaneously with the process of FIG. 19B to form a hard mask on bit contact region 33. Second metal film 12 and polysilicon film 11 in the memory cell region are dry-etched using the hard mask. Consequently, bit line 31 including polysilicon film 11d and second metal film 12d is formed on bit contact region 33.

As described above, hard masks made of silicon nitride films 15a and 15b are disposed on first and second gate electrodes 17a and 17b, third wiring 20' and bit line 31.

Figure 20:
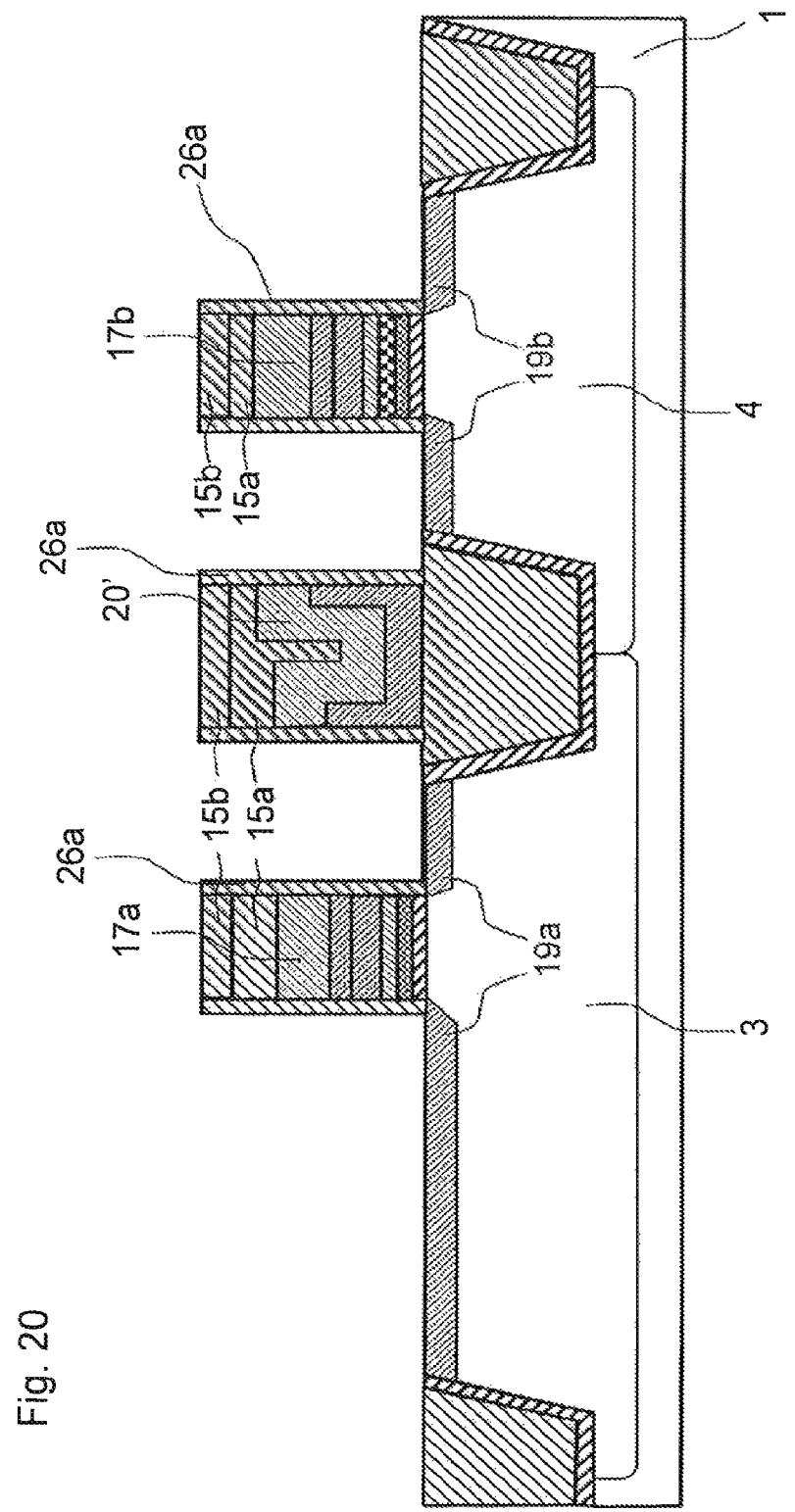
FIG. 20 illustrates a method of manufacturing a semiconductor device according to the first exemplary embodiment.

As illustrated in FIG. 20, a silicon nitride film is formed on the entire surface of semiconductor substrate 1 and then etched back, thereby forming offset spacers 26a on the side surfaces of first and second gate electrodes 17a and 17b and third wiring 20'. LDD regions 19a are formed by implanting an impurity of the N conductivity type into P well 3 using hard masks 15a and 15b and offset spacer 26a as masks. LDD regions 19b are formed by implanting an impurity of the P conductivity type into N well 4 using hard masks 15a and 15b and offset spacer 26a as masks.

Figure 21:
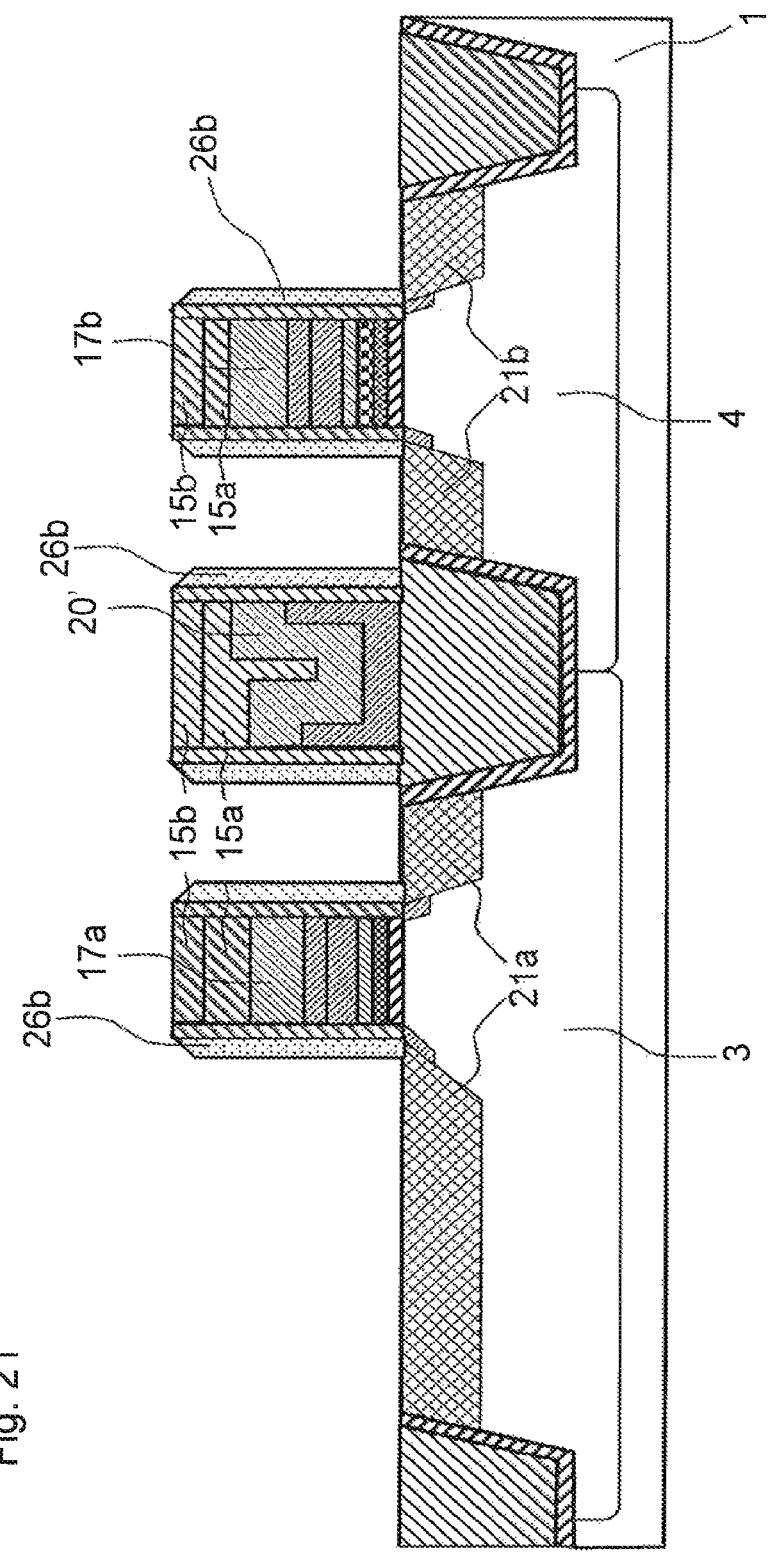
FIG. 21 illustrates a method of manufacturing a semiconductor device according to the first exemplary embodiment.

As illustrated in FIG. 21, a silicon oxide film is formed on the entire surface of semiconductor substrate 1, and then a portion of the silicon oxide film deposited in the memory cell region is selectively removed using lithography and wet etching techniques. Thereafter, a portion of the silicon oxide film in the peripheral circuit region is etched back to form sidewall spacers 26b on the side surfaces of first and second gate electrodes 17a and 17b and third wiring 20'. An impurity of the N conductivity type is implanted into P well 3 using hard masks 15a and 15b, offset spacers 26a and sidewall spacers 26b as masks to form first source and drain 21a. An impurity of the P conductivity type is implanted into N well 4 using hard masks 15a and 15b, offset spacers 26a and sidewall spacers 26b as masks to form second source and drain 21b.

Figure 22:
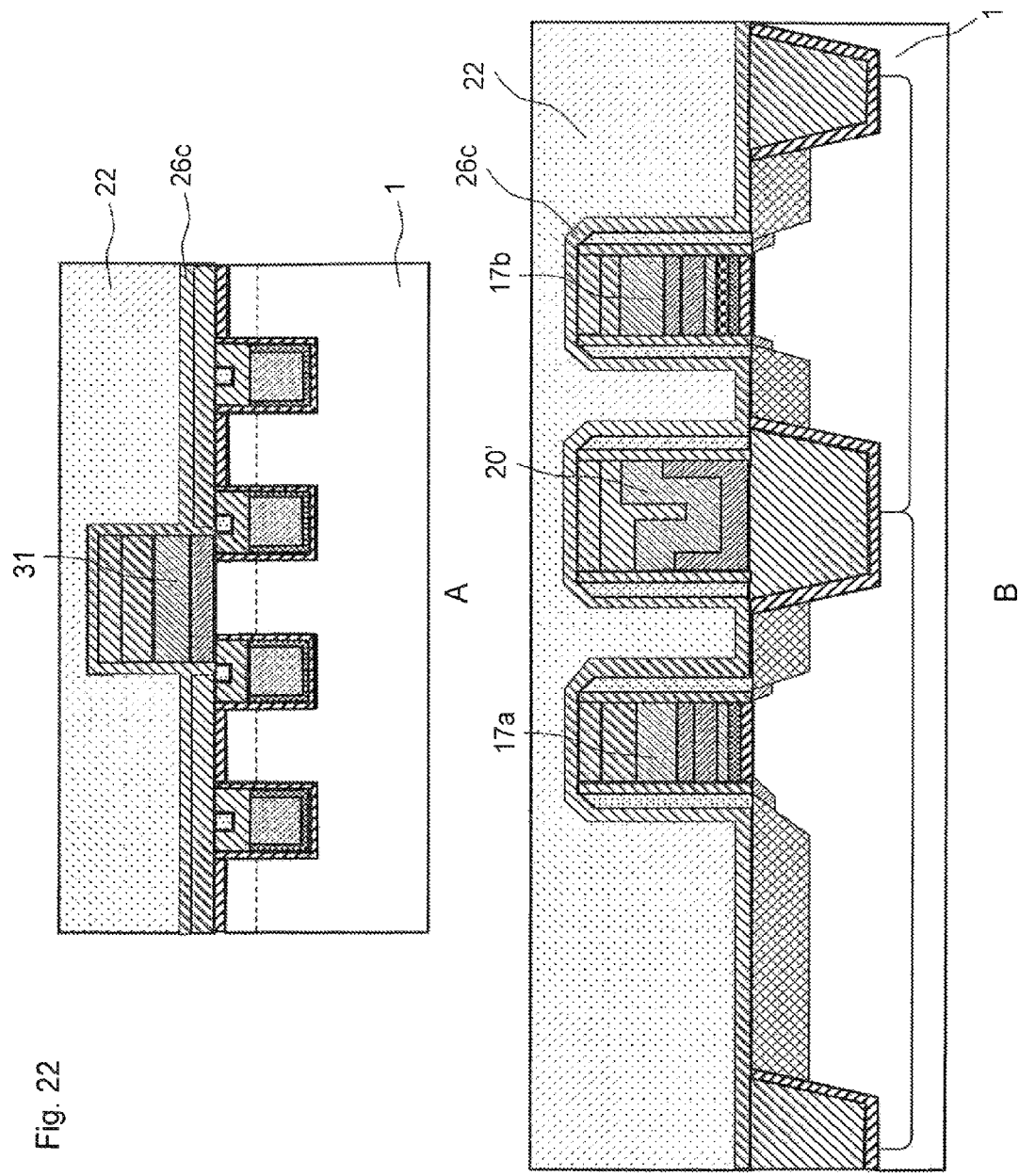
FIG. 22 illustrates a method of manufacturing a semiconductor device according to the first exemplary embodiment.

As illustrated in FIG. 22, liner film 26c made of a silicon nitride film is formed on the entire surface of semiconductor substrate 1, so as to cover first and second gate electrodes 17a and 17b and third wiring 20' in the peripheral circuit region and bit line 31 in the memory cell region. A coating-based insulating film is formed on the entire surface of semiconductor substrate 1 and then anneal-treated to form SOD film 22.

Figure 23:
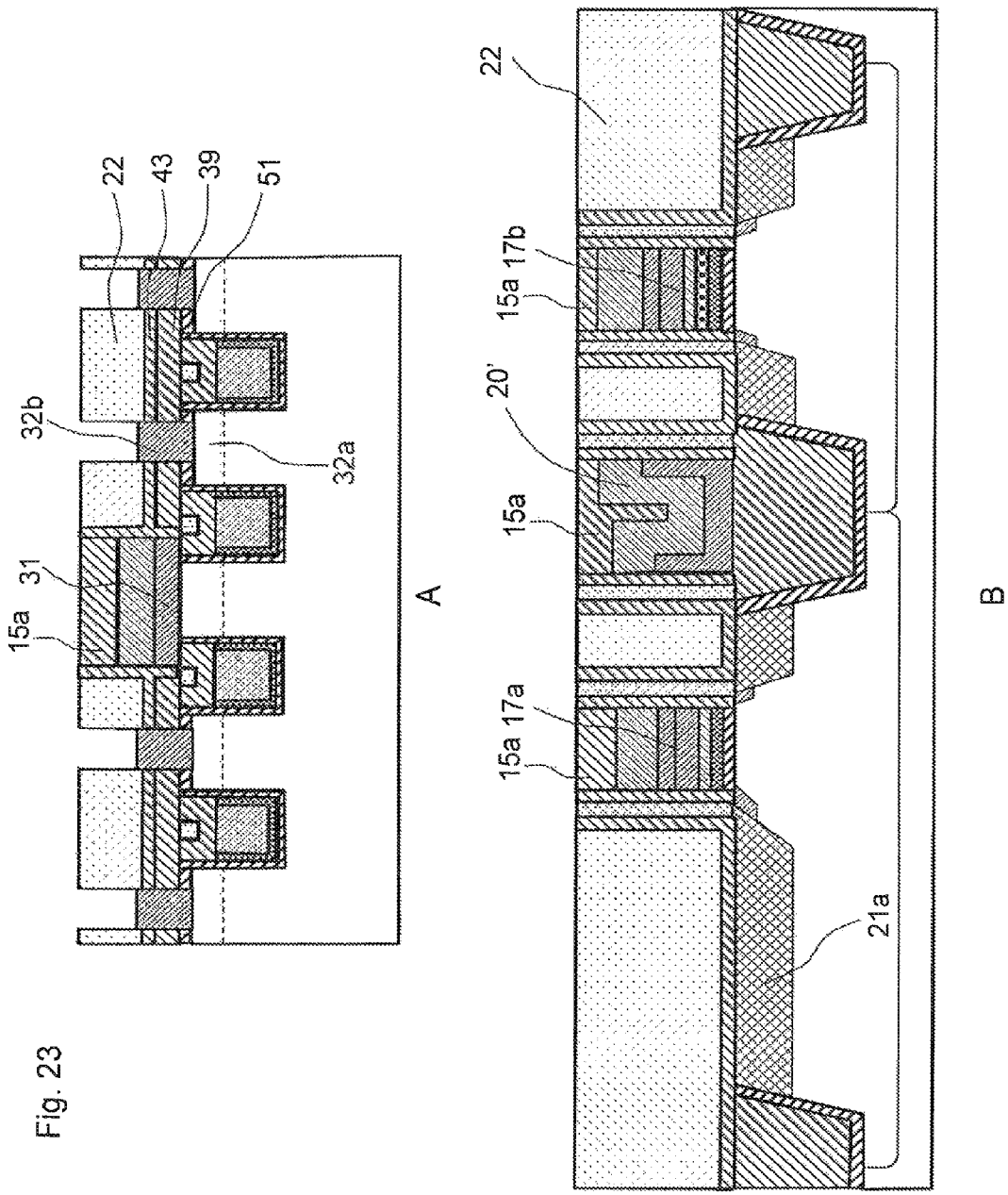
FIG. 23 illustrates a method of manufacturing a semiconductor device according to the first exemplary embodiment.

Next, as illustrated in FIG. 23, a contact hole is formed so as to penetrate through SOD film 22, liner film 43, bit contact interlayer insulating film 39 and silicon oxide film 51 and expose capacitor contact region 32a. After the contact hole is filled with a polysilicon film, the polysilicon film, silicon nitride film (not illustrated) 15b and SOD film 22 are CMP-treated and planarized. At this time, silicon nitride film 15b formed by a plasma CVD method is removed so that only silicon nitride film 15a formed by an ALD method remains on first and second gate electrodes 17a and 17b, third wiring 20' and bit line 31. In addition, the polysilicon film is etched back to recess the upper surface thereof, thereby forming capacitor contact plugs 32b.

Figure 24:
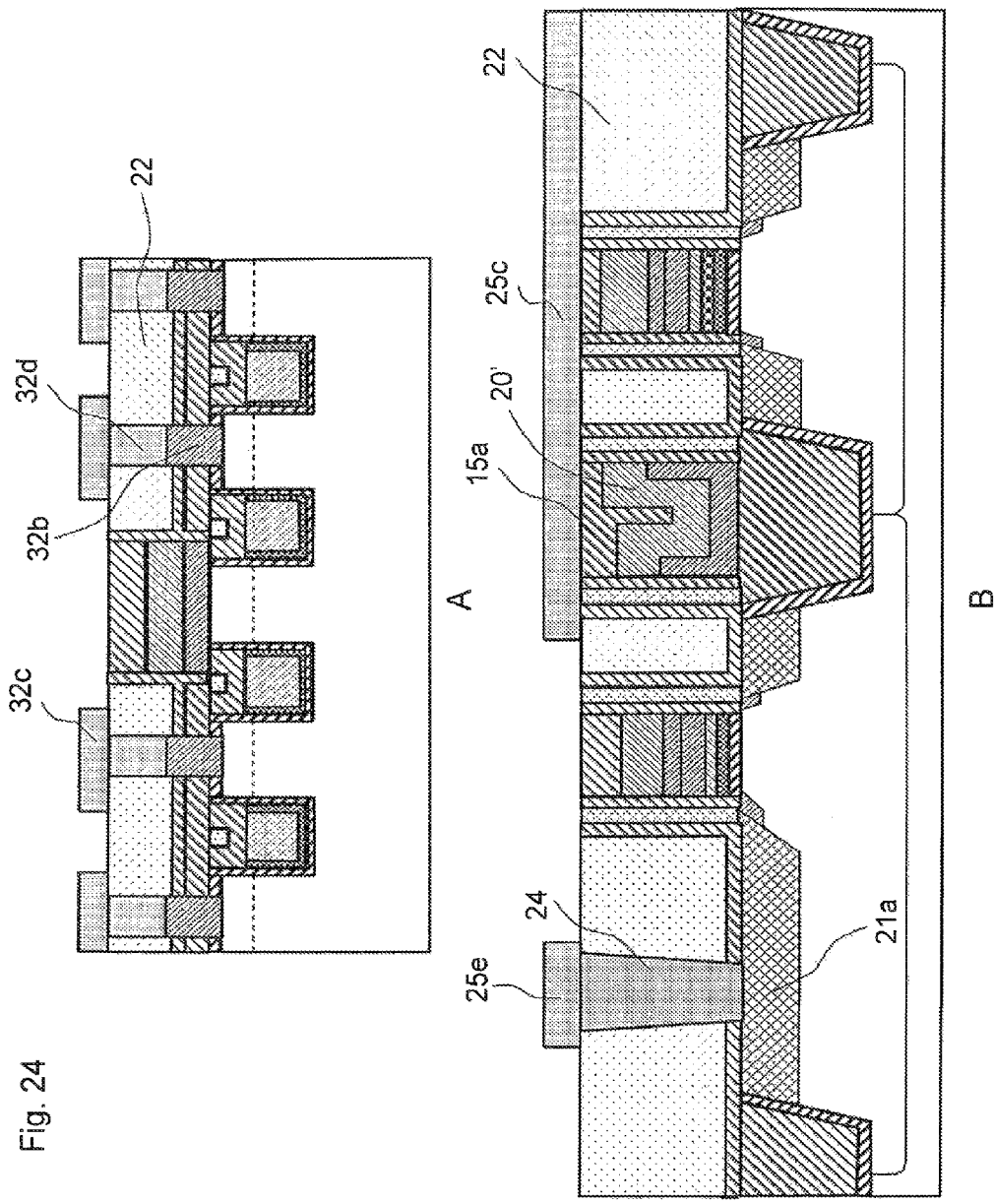
FIG. 24 illustrates a method of manufacturing a semiconductor device according to the first exemplary embodiment.

Next, as illustrated in FIG. 24, a contact hole is formed within SOD film 22 using lithography and dry etching techniques, so as to expose first source and drain 21a. An electrically conductive material, such as tungsten, is filled in the contact hole to form contact plug 24. At this time, the electrically conductive material, such as tungsten, is also deposited on capacitor contact plug 32b in the memory cell region, thus forming capacitor contact plug 32d. Next, the conductive film made from tungsten or the like is patterned using lithography and dry etching techniques. Consequently, a plurality of fourth wirings are formed (see FIG. 1B—only one fourth wiring 25c is shown in FIG. 24B), so as to contact with silicon nitride film 15a on SOD film 22 (third wiring 20'), and fifth wiring 25e is formed so as to contact with contact plug 24. At this point, capacitor contact pad 32c is formed at the same time, so as to contact with capacitor contact plug 32d.

Subsequently, as illustrated in FIGS. 1A and 2, stopper film 45 made of a silicon nitride film and an interlayer insulating film (not illustrated) are formed so as to cover capacitor contact pad 32c. A cylinder hole is formed so as to expose capacitor contact pad 32c within the interlayer insulating film and stopper film 45, and then lower electrode 48a is formed on the inner wall surfaces of the cylinder hole. Thereafter, the interlayer insulating film in the memory cell region is removed to expose the outer lateral surfaces of lower electrode 48a. Capacitor insulating film 48b is formed on the exposed surfaces of lower electrode 48a, and then upper electrode 48c is further formed so as to cover lower electrode 48a and capacitor insulating film 48b. Consequently, there is completed crown-shaped capacitor 48 composed of lower electrode 48a, capacitor insulating film 48b and upper electrode 48c.

In the present exemplary embodiment, seam (concave portion) 14 of third wiring 20' is filled with silicon nitride film (buried insulating film) 15a. Accordingly, there is no such possibility that an electrically conductive material is filled in seam 14 in the process of forming a conductive film after the formation of the third wiring (the process of forming contact plug 24 and capacitor contact plug 32d in the present exemplary embodiment). Consequently, third wiring 20' can be prevented from electrically connecting to the plurality of fourth wirings. As a result, it is possible to prevent the plurality of fourth wirings from short-circuiting to one another through third wiring 20 to degrade device characteristics.

Second Exemplary Embodiment

The present exemplary embodiment differs in that instead of the processes of FIGS. 17 and 18 in the first exemplary embodiment, silicon nitride film 15c is formed by a plasma CVD method after polysilicon film 11 and second metal film 12 are formed and, thereafter, silicon nitride film 15a is formed by an ALD method and silicon nitride film 15b is formed by a plasma CVD method. The present exemplary embodiment is the same as the first exemplary embodiment except that the process of FIG. 25 is carried out instead of the processes of FIGS. 17 and 18 in the first exemplary embodiment, and therefore, only the process of FIG. 25 will be described here.

Figure 25:
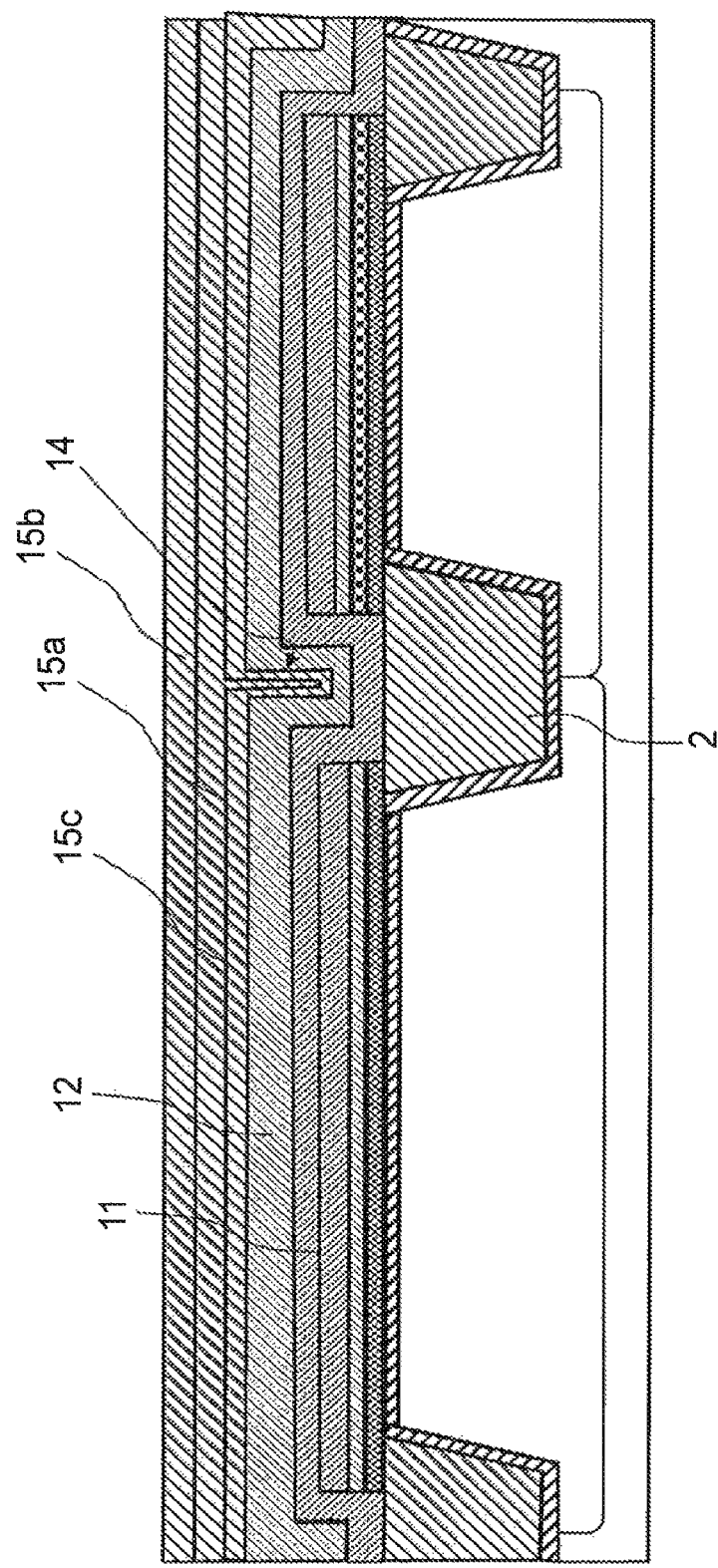
FIG. 25 illustrates a method of manufacturing a semiconductor device according to the second exemplary embodiment.
Figure 26:
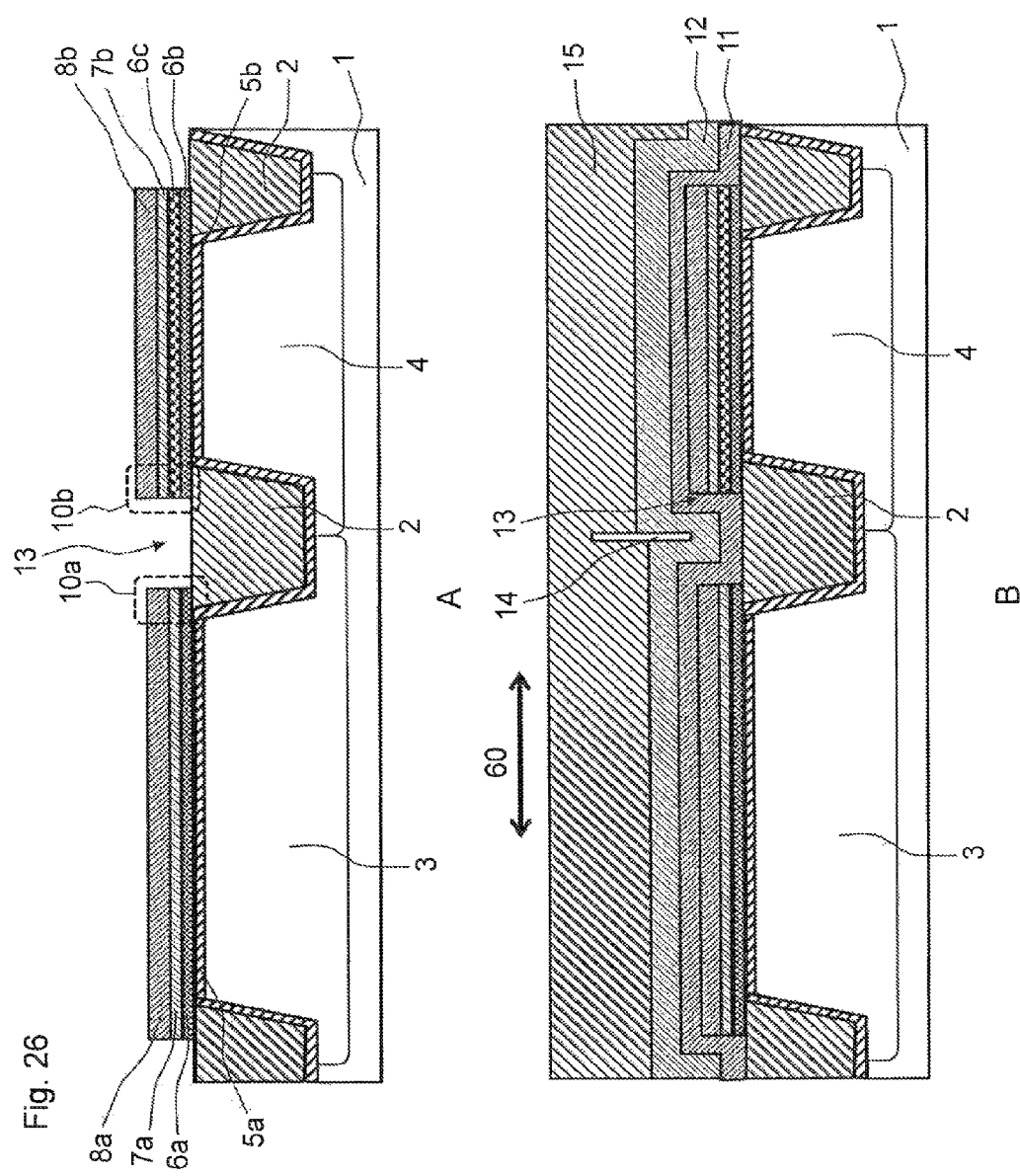
FIG. 26 illustrates a related method of manufacturing a semiconductor device.
Figure 27:
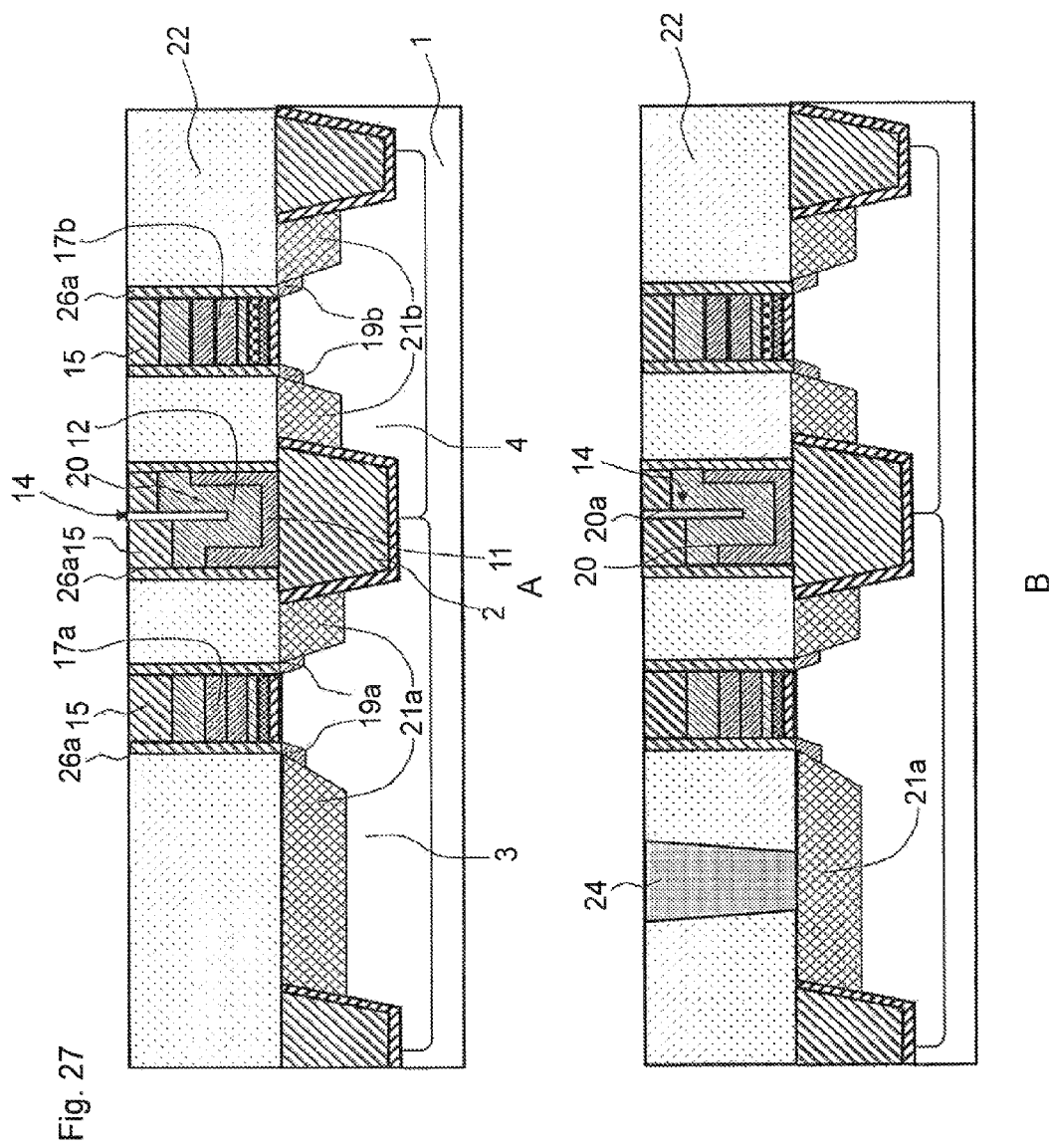
FIG. 27 illustrates a related method of manufacturing a semiconductor device.
Figure 28:
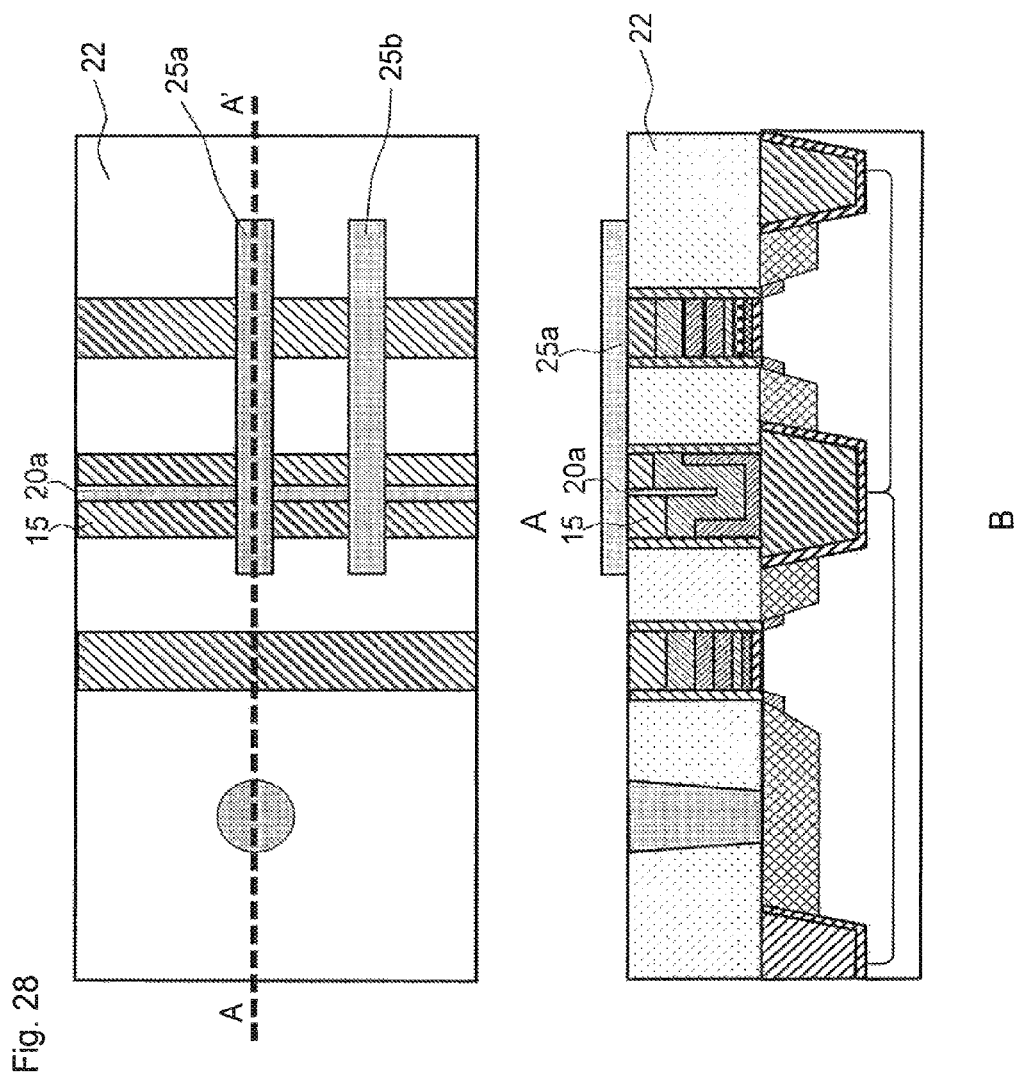
FIG. 28 illustrates a related method of manufacturing a semiconductor device.

In the process of FIG. 25, silicon nitride film (first insulating film) 15c is formed first by a plasma CVD method. Since this plasma CVD method is not superior in coverage (step coverage), it is not possible to completely fill seam 14 (concave portion) above isolation region 2 in the peripheral circuit region with silicon nitride film 15c. It is possible to fill seam 14 (concave portion) above isolation region 2 with silicon nitride film 15a, however, by subsequently forming silicon nitride film (buried insulating film) 15a using an ALD method. Thereafter, silicon nitride film (first insulating film) 15b is further formed by a plasma CVD method.

In the present exemplary embodiment, silicon nitride film 15c is formed first by a plasma CVD method and, thereafter, silicon nitride film 15a for filling seam 14 is formed by an ALD method. The plasma CVD method is higher in the rate of film formation than the ALD method. Accordingly, it is possible to further improve throughputs, compared with the first exemplary embodiment in which silicon nitride film 15a is formed using the ALD method from the beginning until seam 14 is filled. Note that a plurality of films may be formed in seam 14 of third wiring 20' by going through a plurality of film formation processes. In this case, at least one film formation process superior in coverage needs to be applied in order to completely fill seam 14 with a film. In other film formation processes, however, films inferior in coverage may be formed or films superior in coverage may be formed.

In the first and second exemplary embodiments, silicon nitride film 15a is formed by an ALD method, in order to fill seam 14 above isolation region 4 in the peripheral circuit region. However, a film-forming method for filling seam 14 is not limited to an ALD method. Other film-forming methods may be used as long as the methods are superior in coverage and capable of filling seam 14. As such film-forming methods, it is possible to use, for example, a low-pressure CVD (LPCVD: Low-Pressure Chemical Vapor Deposition) method or a plasma CVD method lower in the rate of film formation than a plasma CVD method used in the first and second exemplary embodiments.

Third Exemplary Embodiment

The present exemplary embodiment differs from the first and second exemplary embodiments in that a silicon nitride film is formed by a plasma CVD method superior in coverage to fill the seam of the third wiring. More specifically, silicon nitride film 15a is formed by a plasma CVD method superior in coverage in the process of FIG. 18 in the first exemplary embodiment. Alternatively, at least one of silicon nitride films 15a and 15b is formed by a plasma CVD method superior in coverage in the process of FIG. 25 in the second exemplary embodiment. Specific film-forming conditions for the CVD method to be superior in coverage are not limited in particular. It is possible to adjust film-forming conditions as appropriate, according to the properties of the seam of the third wiring. For example, a raw material gas is sufficiently supplied into the seam by increasing a source gas ($SiH_4$, $NH_3$ or the like) and decreasing a carrier gas ($N_2$ or the like) at the time of film formation, thereby performing film formation so that a film-forming reaction adequately takes place within the seam. In addition, RF high-frequency power is decreased at the time of film formation to lower the rate of film formation, thereby allowing a raw material gas to adequately reach the interiors of the seam. RF low-frequency power is slightly increased to improve the directionality of a source gas toward a substrate in which the third wiring is formed.

Also in the present exemplary embodiment, it is possible to form a buried insulating film superior in coverage (step coverage), so as to fill the concave portion of the third wiring. Consequently, it is possible to prevent a plurality of adjacent fourth wirings from short-circuiting to one another through the third wiring to degrade device characteristics.

In the first to third exemplary embodiments, first metal films 6a and 6b may be made of the same material or different materials. For example, in a case where different materials are used to set work functions separately for first metal films 6a and 6b, the NMOS may be composed of gate electrode which includes material other than a titanium nitride film, for example, a TaN, and the PMOS may be composed of a gate electrode containing a titanium nitride film. In addition, the gate electrodes of both MOS transistors may contain TiN and polysilicon, the gate electrode of the PMOS may contain Al, and the gate electrode of the NMOS may contain La or Mg. In a case where the same material is used for first metal films 6a and 6b, the same material, such as TiSiN, TaN or TiN, may be used for the gate electrodes of the NMOS and the PMOS to set work functions separately by varying the thicknesses of the electrodes.

The materials of the high-dielectric insulating films used in the first to third exemplary embodiments are not limited in particular, as long as the materials are higher in dielectric constant than oxide silicon. It is possible to use at least one insulating material selected from the group consisting of HfSiO, HfSiON, $ZrO_2$, ZrSiO, ZrSiON, $Ta_2O_5$, $Nb_2O_5$, $Al_2O_3$, $HfO_2$, $ScO_3$, $Y_2O_3$, $La_2O_3$, $CeO_3$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$.

The second metal films used in the first to third exemplary embodiments are not limited in particular. In addition to the second metal films shown in the first to third exemplary embodiments, it is possible to use, for example, a laminated film composed of a tungsten silicide film, a tungsten nitride film and a tungsten film.

It is apparent that the present invention is not limited to the above embodiments, but may be modified and changed without departing from the scope and spirit of the invention.

What is claimed is:

1. A method of forming a semiconductor device, comprising:

forming a plurality of isolation regions on a semiconductor substrate that are laterally spaced from one another by semiconductive material of the semiconductor substrate in a straight line vertical cross section;

forming a first stack over a first portion of the semiconductor substrate, the first stack comprising hafnium and metal, the first stack having a first terminating edge that is over one of the spaced isolation regions in the straight line vertical cross section;

forming a second stack over a second portion of the semiconductor substrate the second stack comprising hafnium and metal, the second stack having a second terminating edge that is over the one spaced isolation region and is spaced from the first terminating edge in the straight line vertical cross section;

forming a conductive layer over the first and second stacks and over the one isolation region between the first and second terminating edges in the straight line vertical cross section;

forming a first nitride layer over the conductive layer by using a first deposition method;

forming a second nitride layer over the first nitride layer by using a second deposition method different from the first disposition method; and removing a portion of the second nitride layer, a portion of the first nitride layer, a portion of the conductive layer, a portion of the second stack and a portion of the first stack, so as to form a third stack, a fourth stack and a fifth stack, the third stack comprising a material of the first stack, the conductive layer, the first and second nitride layers, the fourth stack comprising a material of the second stack, the conductive layer, the first and second nitride layers, the fifth stack comprising the conductive layer and the first and second nitride layers and placed between the third and fourth stacks over the one isolation region in the straight line vertical cross section.

2. The method as claimed in claim 1, wherein the first deposition method is an atomic layer deposition.

3. The method as claimed in claim 1, wherein the first deposition method is a low pressure chemical vapor deposition.

4. The method as claimed in claim 3, wherein the second deposition method is a plasma chemical vapor deposition.

5. The method as claimed in claim 1, the method further comprising:
forming a first contact plug beside the third stack.

6. The method as claimed in claim 5, the method further comprising:
forming a second contact plug beside the fifth stack.

7. The method as claimed in claim 6, the method further comprising:
forming a conductive wiring over the third, fourth and fifth stacks and the first and second contact plugs, so that the conductive wiring is electively connected to the first and second contact plugs.

8. The method as claimed in claim 1, wherein the conductive layer is formed such that the conductive layer comprises a seam in the fifth stack over the one isolation region in the straight line vertical cross section.

9. A method of forming a semiconductor device, comprising:
forming an isolation region on a semiconductor substrate;
forming a first stack over a first portion of the semiconductor substrate and on a first portion of the isolation region, the first stack comprising hafnium and metal;
forming a second stack over a second portion of the semiconductor substrate and a second portion of the isolation region, the second portion of the isolation region being apart from the first portion of the isolation region via a third portion thereof, the second stack comprising hafnium and metal;
forming a conductive layer over the first and second stacks and the third portion of the isolation region;
forming a first nitride layer over the conductive layer by using a first deposition method;
forming a second nitride layer over the first nitride layer by using a second deposition method different from the first disposition method;
removing a portion of the second nitride layer, a portion of the first nitride layer, a portion of the conductive layer, a portion of the second stack and a portion of the first stack, so as to form a third stack, a fourth stack and a fifth stack, the third stack comprising a material of the first stack, the conductive layer, the first and second nitride layers, the fourth stack comprising a material of the second stack, the conductive layer, the first and second nitride layers, the fifth stack comprising the conductive layer and the first and second nitride layers and placed between the third and fourth stacks over the third portion of the isolation region; and the conductive layer is formed such that the conductive layer comprises a seam over the third portion of the isolation region, the first nitride layer is formed so as to fill the seam.

10. A method of forming a semiconductor device, comprising:
forming a first insulating layer comprising Hafnium over a semiconductor substrate comprising an isolation region dividing the semiconductor substrate into first and second portions;
forming a first metal layer over the first insulating layer;
removing a portion of the first insulating layer and a portion of the first metal layer to form a first stack including the first insulating layer and the first metal layer over the first portion of the semiconductor substrate, an end of the first stack being positioned over the isolation region;
forming a second insulating layer comprising Hafnium over the first stack, the second portion of the semiconductor substrate and the isolation region;
forming a second metal layer over the second insulating layer;
removing a portion of the second insulating layer and a portion of the second metal layer to form a second stack including the second insulating layer and the second metal layer over the second portion of the semiconductor substrate, an end of the second stack being positioned over the isolation region and apart from the end of the first stack;
forming a conductive layer over the first and second stacks and the isolation region;
forming a first nitride layer over the conductive layer by using a first deposition method;
forming a second nitride layer over the first nitride layer by using a second deposition method different from the first disposition method; and
removing a portion of the second nitride layer, a portion of the first nitride layer, a portion of the conductive layer, a portion of the second stack and a portion of the first stack, so as to form a third stack, a fourth stack and a fifth stack, the third stack comprising a material of the first stack, the conductive layer, the first and second nitride layers, the fourth stack comprising a material of the second stack, the conductive layer, the first and second nitride layers, the fifth stack comprising the conductive layer and the first and second nitride layers and placed between the third and fourth stacks over the isolation region.

11. The method as claimed in claim 10, wherein the first deposition method is an atomic layer deposition.

12. The method as claimed in claim 10, wherein the first deposition method is a low pressure chemical vapor deposition.

13. The method as claimed in claim 12, wherein the second deposition method is a plasma chemical vapor deposition.

14. The method as claimed in claim 10, the method further comprising:
forming a first contact plug beside the third stack.

15. The method as claimed in claim 14, the method further comprising:
forming a second contact plug beside the fifth stack.

16. The method as claimed in claim 15, the method further comprising:
forming a conductive wiring over the third, fourth and fifth stacks and the first and second contact plugs, so that the conductive wiring is electively connected to the first and second contact plugs.

17. The method as claimed in claim 10, wherein the conductive layer is formed such that the conductive layer comprises a seam over the isolation region.

18. The method as claimed in claim 17, wherein the first nitride layer is formed so as to fill the seam.

19. A method of forming a semiconductor device, comprising:

forming a conductive layer over a semiconductor substrate to cover first and second stacks each comprising hafnium and metal over the semiconductor substrate, the first and second stacks being placed apart from each other over an isolation region formed on the semiconductor substrate, the conductive layer being also formed to cover the isolation region;

forming a first nitride layer over the conductive layer by using a first deposition method;

forming a second nitride layer over the first nitride layer by using a second deposition method different from the first disposition method;

removing a portion of the second nitride layer, a portion of the first nitride layer, a portion of the conductive layer, a portion of the second stack and a portion of the first stack, so as to form a third stack, a fourth stack and a fifth stack, the third stack comprising a material of the first stack, the conductive layer, the first and second nitride layers, the fourth stack comprising a material of the second stack, the conductive layer, the first and second nitride layers, the fifth stack comprising the conductive layer and the first and second nitride layers and placed between the third and fourth stacks over the isolation region; and the conductive layer is formed such that the conductive layer comprises a seam over the third portion of the isolation region, the first nitride layer is formed so as to fill the seam.

20. The method as claimed in claim 19, wherein the first deposition method is an atomic layer deposition.

* * * * *